(12) United States Patent
Jeong et al.

(10) Patent No.: US 11,094,916 B2
(45) Date of Patent: Aug. 17, 2021

(54) DISPLAY DEVICE AND METHOD FOR MANUFACTURING THE SAME

(71) Applicant: Samsung Display Co., Ltd., Yongin-si (KR)

(72) Inventors: Changyong Jeong, Yongin-si (KR); Mugyeom Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 76 days.

(21) Appl. No.: 15/694,190

(22) Filed: Sep. 1, 2017

(65) Prior Publication Data

US 2018/0151845 A1 May 31, 2018

(30) Foreign Application Priority Data

Nov. 28, 2016 (KR) .......................... 10-2016-0159636

(51) Int. Cl.
*H01L 51/52* (2006.01)
*H01L 51/00* (2006.01)
*H01L 51/56* (2006.01)
*H01L 27/32* (2006.01)

(52) U.S. Cl.
CPC ........ *H01L 51/5281* (2013.01); *H01L 27/323* (2013.01); *H01L 51/0097* (2013.01); *H01L 51/52* (2013.01); *H01L 51/56* (2013.01); *H01L 27/3244* (2013.01); *H01L 2251/5338* (2013.01); *H01L 2251/566* (2013.01)

(58) Field of Classification Search
CPC ... H01L 51/5281; H01L 51/52; H01L 27/323; H01L 51/56; H01L 51/0097; H01L 2251/5338; H01L 2251/566; H01L 27/3244
See application file for complete search history.

(56) References Cited

U.S. PATENT DOCUMENTS

| | | | | |
|---|---|---|---|---|
| 6,219,127 B1 * | 4/2001 | Hirakata | ............... | G02F 1/1341 349/153 |
| 2004/0212749 A1 | 10/2004 | Yu et al. | | |
| 2008/0165315 A1 * | 7/2008 | Nishida | ................. | G02B 1/118 349/137 |
| 2012/0181923 A1 | 7/2012 | Cho et al. | | |
| 2014/0353625 A1 | 12/2014 | Yi et al. | | |

FOREIGN PATENT DOCUMENTS

| | | |
|---|---|---|
| JP | 2013-228439 | 11/2013 |
| KR | 10-0519370 | 10/2005 |
| KR | 10-2007-0054917 | 5/2007 |
| KR | 10-2011-0022381 | 3/2011 |
| KR | 10-2012-0082736 | 7/2012 |
| KR | 10-2014-0061894 | 5/2014 |
| KR | 10-2014-0142419 | 12/2014 |

* cited by examiner

*Primary Examiner* — Hoang-Quan Ho
(74) *Attorney, Agent, or Firm* — H.C. Park & Associates, PLC

(57) ABSTRACT

A display device includes a display module and an anti-reflection member. The display module includes a display panel having a light emitting element and a sensing layer disposed on the display panel to sense touch. The anti-reflection member is disposed on the display module to reduce reflectance of light that is incident from the outside. One side of the display module has a first shape that gradually decreases in thickness outward, and one side of the anti-reflection member, which corresponds to the one side of the display module, has a second shape that gradually decreases in thickness outward.

13 Claims, 40 Drawing Sheets

DISPLAY DEVICE AND METHOD FOR MANUFACTURING THE SAME

CROSS-REFERENCE TO RELATED APPLICATIONS

This application claims priority from and the benefit of Korean Patent Application No. 10-2016-0159636, filed on Nov. 28, 2016, which is hereby incorporated by reference for all purposes as if fully set forth herein.

BACKGROUND

Field

Exemplary embodiments relate to a display device and a method for manufacturing the same. More particularly, exemplary embodiments relate to a flexible display device and a method for manufacturing the same.

Discussion of the Background

A display device displays various images on a display screen to provide information to a user. In general, a display device displays information within an assigned screen. In recent years, development has taken place on a flexible display device including a flexible display panel. The flexible display device may be foldable, rollable, or bendable such as a paper, unlike a typical flat panel display device. The flexible display device that can vary in shape may be portable without regard to a size of an existing screen so as to improve a user's convenience.

The above information disclosed in this Background section is only for enhancement of understanding of the background of the inventive concepts, and, therefore, it may contain information that does not form the prior art that is already known in this country to a person of ordinary skill in the art.

SUMMARY

Exemplary embodiments provide a display device that is capable of preventing delamination between films from occurring. Exemplary embodiments also provide a method for manufacturing a display device, in which delamination between films may be prevented, and tolerances caused by a plurality of processing steps may be reduced.

Additional aspects will be set forth in the detailed description which follows, and, in part, will be apparent from the disclosure, or may be learned by practice of the inventive concepts.

According to exemplary embodiments, a display device includes a display module and an anti-reflection member. The display module includes a display panel including a light emitting element and a sensing layer disposed on the display panel to sense touch. The anti-reflection member is disposed on the display module to reduce reflectance of light that is incident from the outside. One side of the display module has a first shape that gradually decreases in outward thickness, and one side of the anti-reflection member, which corresponds to the one side of the display module, has a second shape that gradually decreases in outward thickness.

In an exemplary embodiment, each of the first and second shapes may have a triangular shape.

In an exemplary embodiment, the display module may include a first top surface, a first side surface, and a first bottom surface. The first top surface may be adjacent to the anti-reflection member. The first side surface may form an obtuse angle with the first top surface and extend from the first top surface. The first bottom surface may be parallel to the first top surface and extend from the first side surface. The first shape may be defined by the first side surface and the first bottom surface.

In an exemplary embodiment, the anti-reflection member may include a second bottom surface, a second side surface, and a second top surface. The second bottom surface may be adjacent to the display module. The second side surface may form an obtuse angle with the second bottom surface and extend from the second bottom surface. The second top surface may be parallel to the second bottom surface and extend from the second side surface. The second shape may be defined by the second side surface and the second top surface.

In an exemplary embodiment, the display device may further include a side surface protection member disposed on the first side surface and the second side surface, and the side surface protection member may include acryl.

In an exemplary embodiment, the display module may include a first top surface, a first side surface, and a first bottom surface. The first top surface may be adjacent to the anti-reflection member. The first side surface may form an acute angle with the first top surface and extend from the first top surface. The first bottom surface may be parallel to the first top surface and extend from the first side surface. The first shape may be defined by the first top surface and the first side surface.

In an exemplary embodiment, the anti-reflection member may include a second bottom surface, a second side surface, and a second top surface. The second bottom surface may be adjacent to the display module. The second side surface may form an acute angle with the second bottom surface and extend from the second bottom surface. The second top surface may be parallel to the second bottom surface and extend from the second side surface. The second shape may be defined by the second bottom surface and the second side surface.

In an exemplary embodiment, the anti-reflection member may include a polarization member.

In an exemplary embodiment of the inventive concepts, a display device includes an assembly that is divided into a pad area having a first thickness and a non-pad area having a second thickness greater than the first thickness. One side of a cross-section defined by cutting the assembly in a first direction has a first shape, and one side of a cross-section defined by cutting the assembly in a direction perpendicular to the first direction has a second shape different from the first shape.

In an exemplary embodiment, the assembly may include a base layer and a functional layer. The functional layer may be disposed on the base layer and define the non-pad area.

In an exemplary embodiment, the functional layer may include at least one of a barrier layer, a buffer layer, a thin film encapsulation layer, a touch sensing layer, or an anti-reflection member.

In an exemplary embodiment, each of the first and second shapes may include: a first line segment having a first inclination; and a second line segment having a second inclination different from the first inclination and meeting the first line segment. A point at which the first line segment and the second line segment meet each other may be a portion of the assembly which has the largest adhesion force between a plurality of layers constituting the assembly.

In an exemplary embodiment, the assembly may further include a circuit layer including a plurality of transistors, wherein the point at which the first line segment and the second line segment meet each other may be a portion of the circuit layer.

In an exemplary embodiment, the point at which the first line segment and the second line segment meet each other may be a portion of the base layer.

In an exemplary embodiment of the inventive concepts, a method for manufacturing a display device includes an alignment process, an adhesion process, and a cutting process. In the alignment process, a mother glass including a plurality of display modules is aligned with a functional layer including at least one of a mother glass and barrier layer, a buffer layer, a thin film encapsulation layer, a touch sensing layer, or an anti-reflection member. In the adhesion process, the mother glass adheres to the functional layer. In the cutting process, the functional layer is cut by using an upper cutting member, and the mother glass is cut by using a lower cutting member corresponding to the upper cutting member.

In an exemplary embodiment, each of the plurality of display modules may include a pad area, and a plurality of openings corresponding to a position of the pad area may be defined in the functional layer.

In an exemplary embodiment, each of the plurality of openings may have an area greater than that of the corresponding pad area.

In an exemplary embodiment, a plurality of pad areas may correspond to at least one of the plurality of openings.

In an exemplary embodiment, a dummy opening which does not correspond to the plurality of openings may be further defined in the functional layer.

In an exemplary embodiment, the upper cutting member may include: an upper frame; a first upper cutter extending from the upper frame in one direction; and a second upper cutter extending from the upper frame in the other direction different from the one direction. The lower cutting member may include a lower frame and a lower cutter. The lower cutter may include: a first lower cutter extending from the lower frame in a direction opposite to the other direction; and a second lower cutter extending from the lower frame in a direction opposite to the one direction.

In an exemplary embodiment, an angle between the one direction and the other direction may range from about 0 degree to about 90 degrees.

In an exemplary embodiment, the method may further include forming a side surface protection member on the cut surface formed by each of the upper and lower cutting members.

In an exemplary embodiment, the upper cutting member may include an upper frame and an upper cutter. The upper cutter may include a first upper cutter surface and a second upper cutter surface forming an acute angle with the first upper cutter surface and extending from the upper frame. The lower cutting member may include a lower frame and a lower cutter. The lower cutter may include a first lower cutter surface and a second lower cutter surface forming an acute angle with the first lower cutter surface and extending from the lower frame.

In an exemplary embodiment, a recessed groove may be formed in an end of the upper cutter, and an end of the lower cutter may correspond to the groove.

In an exemplary embodiment, the upper cutting member may include: a first upper cutting member; and a second upper cutting member extending from the first upper cutting member. A length of the second upper cutting member in a thickness direction of the mother glass may be greater than that of the first upper cutting member in the thickness direction of the mother glass.

In an exemplary embodiment, each of the plurality of display modules may include an organic light emitting diode.

In an exemplary embodiment, the first cutting process of cutting the functional layer by using the upper cutting member and the second cutting process of cutting the display module by using the lower cutting member may be performed at the same time.

In an exemplary embodiment, one process of the first cutting process of cutting the functional layer by using the upper cutting member and the second cutting process of cutting the display module by using the lower cutting member may be performed first, and then, the other process may be performed.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
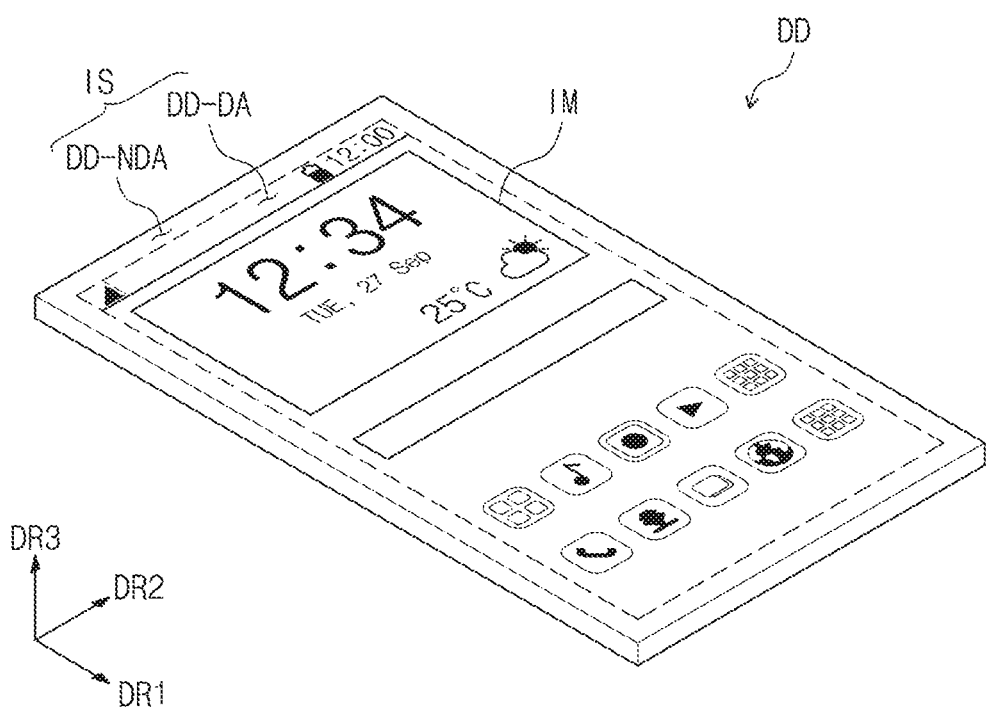
FIG. 1 is a perspective view of a display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z," "at least one of X, Y, or Z," and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. As such, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a perspective view of a display device DD according to an exemplary embodiment. As illustrated in FIG. 1, a display surface IS on which an image IM is displayed is parallel to a surface that is defined by a first directional axis DR1 and a second directional axis DR2. A normal direction of the display surface IS, i.e., a thickness direction of the display device DD is indicated as a third directional axis DR3. A front surface (or top surface) and a rear surface (or bottom surface) of each of the above members is distinguished by the third directional axis DR3. However, directions indicated as the first to third directional axes DR1, DR2, and DR3 may be a relative concept and thus changed into different directions. Hereinafter, the first to third directions may be directions indicated by the first to third directional axes DR1, DR2, and DR3 and designated by the same reference numerals, respectively. Although a flexible display device is illustrated in the current exemplary embodiment, exemplary embodiments are not limited thereto. The display device DD according to the current exemplary embodiment may be a rigid display device.

The display device DD according to an exemplary embodiment of the inventive concepts may be a foldable display device or a rollable display device, but is not specifically limited thereto. The display device DD according to an exemplary embodiment may be used for large-sized electronic devices such as televisions and monitors, or for small and middle-sized electronic devices such as mobile phones, tablet PC, navigation units for vehicles, game consoles, and smart watches.

As illustrated in FIG. 1, the display surface IS of the display device DD may include a plurality of areas. The display device DD includes a display area DD-DA on which the image IM is displayed and a non-display area DD-NDA that is adjacent to the display area DD-DA. The non-display area DD-NDA may be an area on which an image is not displayed. FIG. 1 illustrates icons and a clock window of application as an example of the image IM. The display area DD-DA may have a rectangular shape. The non-display area DD-NDA may surround the display area DD-DA. However, exemplary embodiments are not limited thereto. For example, the display area DD-DA and the non-display area DD-NDA may be relatively designed in different shapes.

The display device DD may include a housing (not shown). The housing (not shown) may be disposed outside the display device DD to accommodate components therein.

FIGS. 2A to 2E are views illustrating a state in which the display device DD of FIG. 1 is folded or rolled.

Figure 2A:
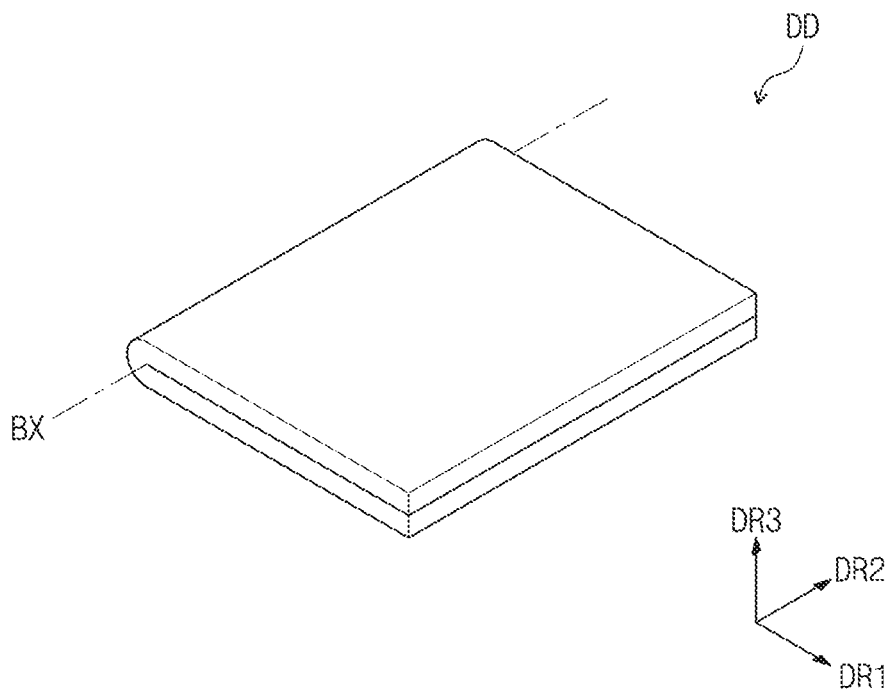
FIG. 2A, FIG. 2B, FIG. 2C, FIG. 2D, and FIG. 2E are views illustrating a state in which the display device of FIG. 1 is folded or rolled.

Referring to FIG. 2A, the display device DD according to an exemplary embodiment may be folded inward from the middle with respect to a bending axis BX.

Figure 2B:
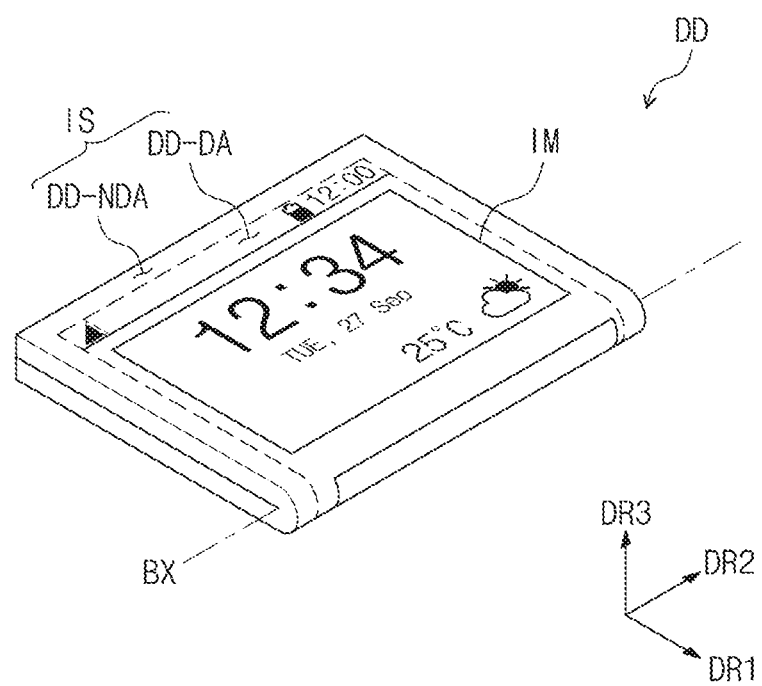
Figure 2C:
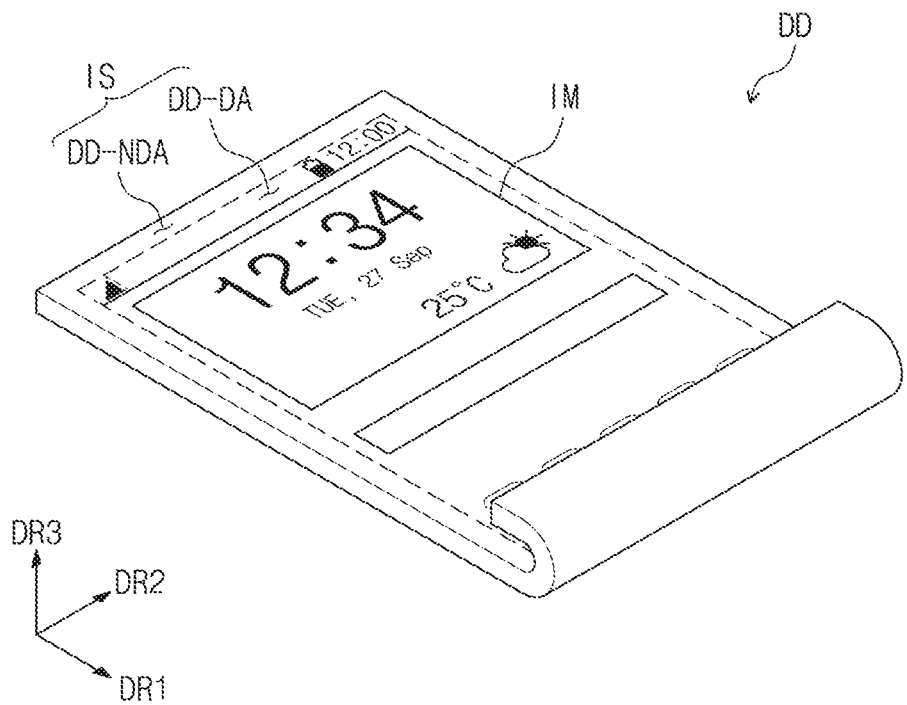
Figure 2D:
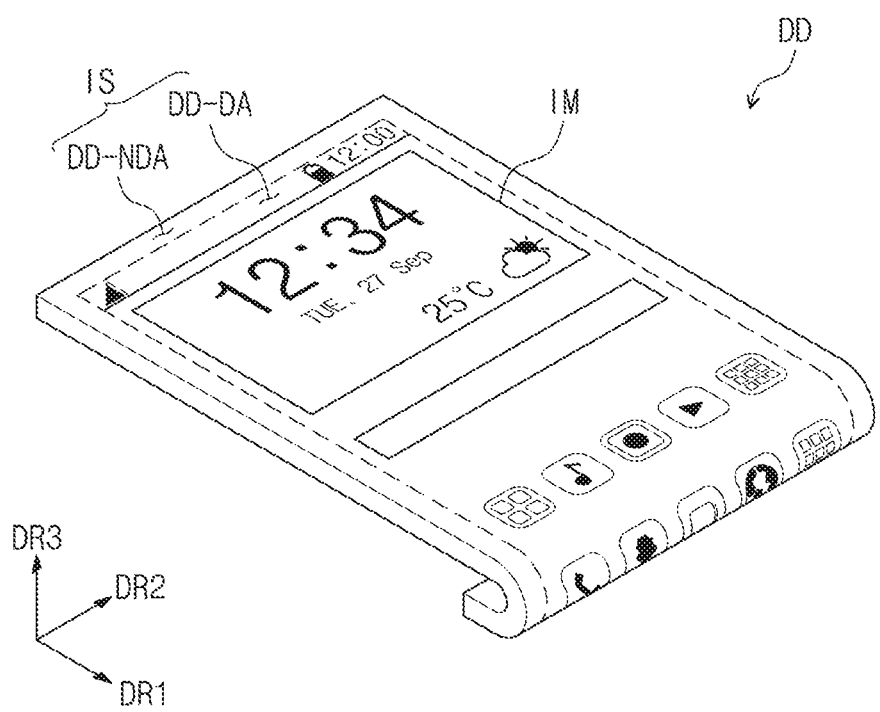
Figure 2E:
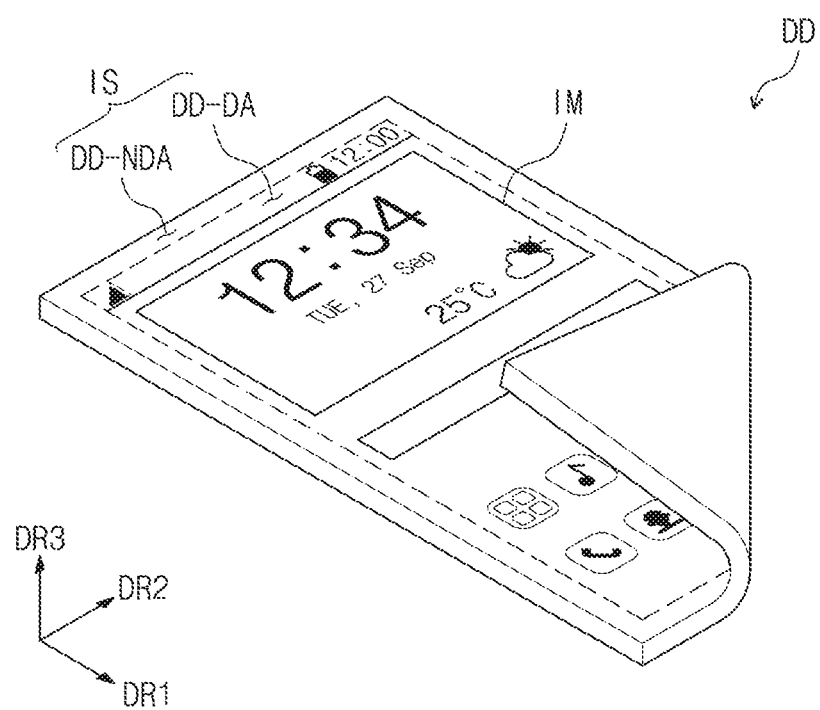

Referring to FIG. 2B, the display device DD according to an exemplary embodiment may be folded outward from the middle with respect to the bending axis BX. Referring to FIG. 2C, the display device DD according to an exemplary embodiment may be rolled or folded inward from an end thereof. Referring to FIG. 2D, the display device DD according to an exemplary embodiment may be rolled or folded outward from the end thereof. Referring to FIG. 2E, the display device DD according to an exemplary embodiment may be rolled or folded in a diagonal direction. FIGS. 2A to 2E are views illustrating examples in which the display device DD is folded or rolled, but is not limited thereto.

Figure 3:
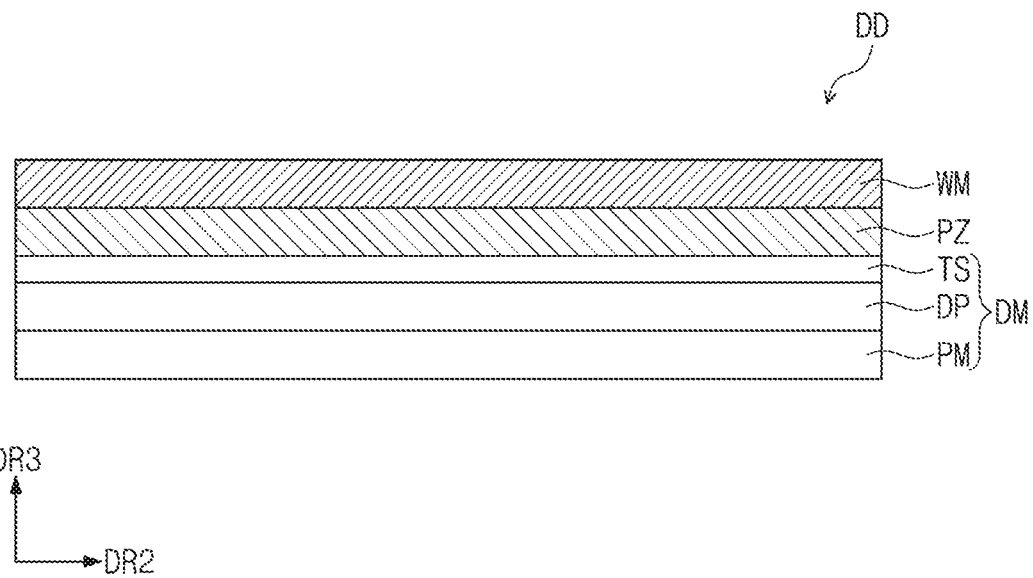
FIG. 3 is a cross-sectional view of the display device according to an exemplary embodiment.

FIG. 3 is a cross-sectional view of the display device DD according to an exemplary embodiment. FIG. 3 illustrates a cross-section defined by the second directional axis DR2 and the third directional axis DR3.

As illustrated in FIG. 3, the display device DD includes a window WM, an anti-reflection member PZ, and a display module DM. The display module DM includes a protection film PM, a display panel DP, and a sensing layer TS.

Although not shown, the display device DD may further include a first adhesion member, a second adhesion member, and a third adhesion member. The first adhesion member may couple the display panel DP to the protection member PM, the second adhesion member may couple the display module DM to the anti-reflection member PZ, and the third adhesion member may couple the anti-reflection member PZ to the window WM.

Each of the first adhesion member, the second adhesion member, and the third adhesion member may be an optically clear adhesive film (OCA), an optically clear resin (OCR), or a pressure sensitive adhesive film (PSA). Each of the first, second, and third adhesion members may include a photo-curable adhesion material or a heat-curable adhesion material. However, exemplary embodiments are not particularly limited thereto.

The protection film PM and the window WM may be continuously manufactured through a coating process. The protection film PM protects the display module DM. The protection film PM prevents external moisture from being permeated into the display member DM and absorbs an external impact.

The protection film PM may include a plastic film as a base layer. The protection film PM may include a plastic film having one selected from the group including polyethersulfone (PES), polyacrylate (PAR), polyetherimide (PEI), polyethylenenaphthalate (PEN), polyethyleneterephthalate (PET), polyphenylene sulfide (PPS), polyarylate, polyimide (PI), polycarbonate (PC), poly(arylene ethersulfone), and a combination thereof.

A material for forming the protection film PM is not limited to plastic resins. For example, the protection film PM may include an organic/inorganic composite material. The protection film PM may include a porous organic layer and an inorganic material that is filled into pores of the organic layer. The protection film PM may further include a film-functional layer disposed on a plastic film. The film-functional layer may include a resin layer. The film-functional layer may be formed in a coating manner.

The window WM protects the display module DM against the external impact and provides an input surface to a user.

The display panel DP and the sensing layer TS may be integrated with each other through the continuous process. However, exemplary embodiments are not limited thereto. For example, the sensing layer TS may adhere to the display panel DP by using the adhesion member. The display panel DP generates the image (see reference symbol IM of FIG. 1) corresponding to inputted image data.

The anti-reflection member PZ may polarize, absorb, or destructively interfere with light incident from the outside to reduce reflectance of external light. The anti-reflection member PZ may include a polarization member, a color filer, a laminated structure of a conductive layer/a dielectric layer/a conductive layer, but is not limited thereto.

Although not particularly shown, the display device DD may further include a frame structure for maintaining the states illustrated in FIGS. 2A to 2E. The frame structure may include a joint structure or a hinge structure.

Figure 4:
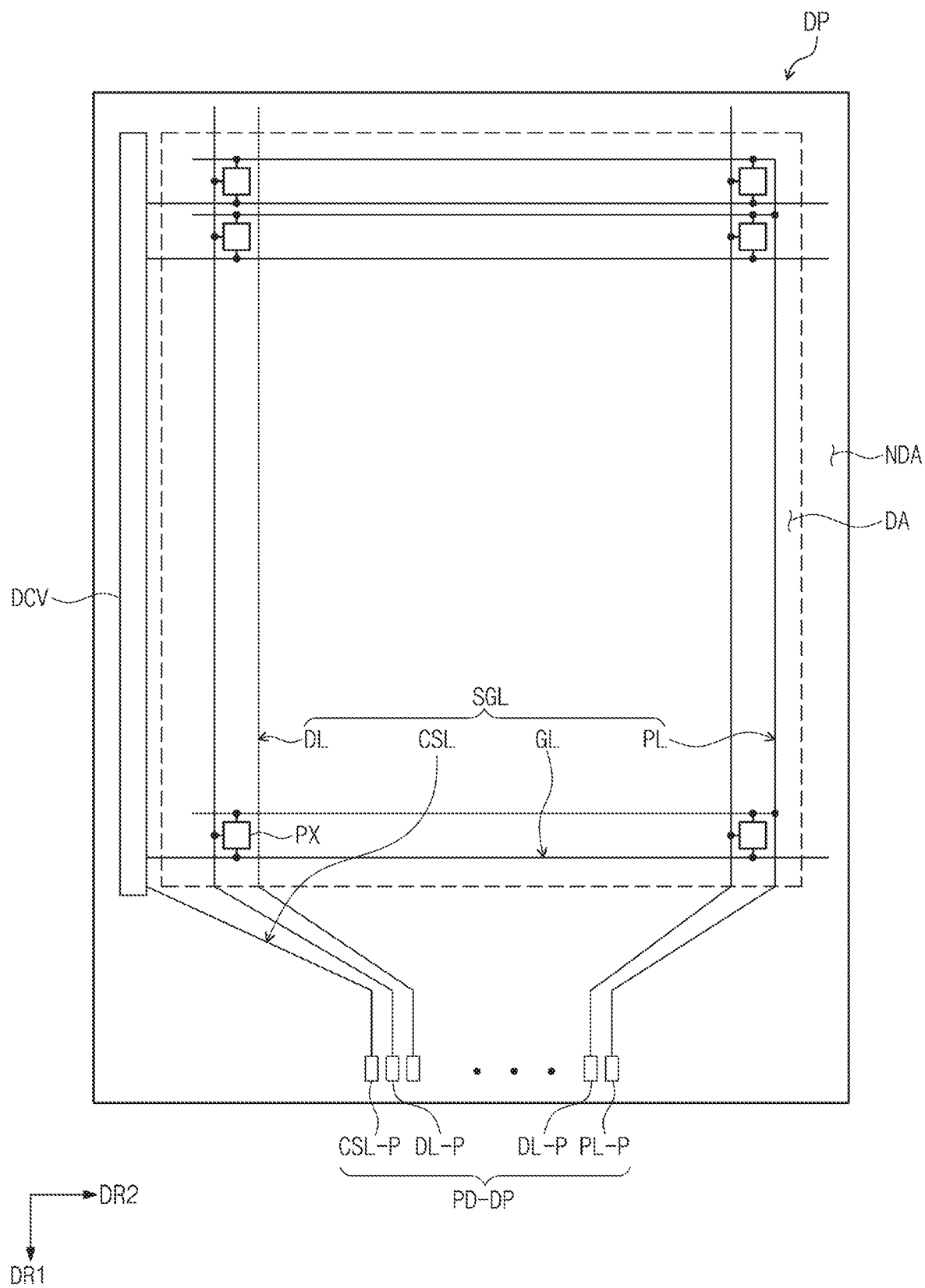
FIG. 4 is a plan view of a display panel according to an exemplary embodiment.
Figure 5:
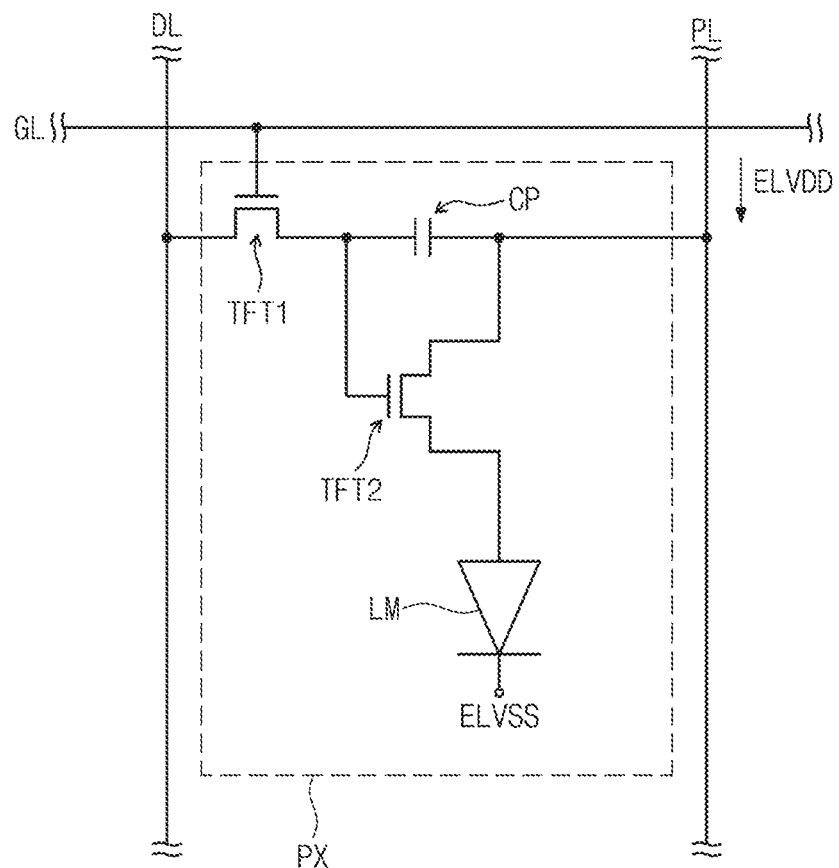
FIG. 5 is an equivalent circuit diagram of a pixel according to an exemplary embodiment.
Figure 6:
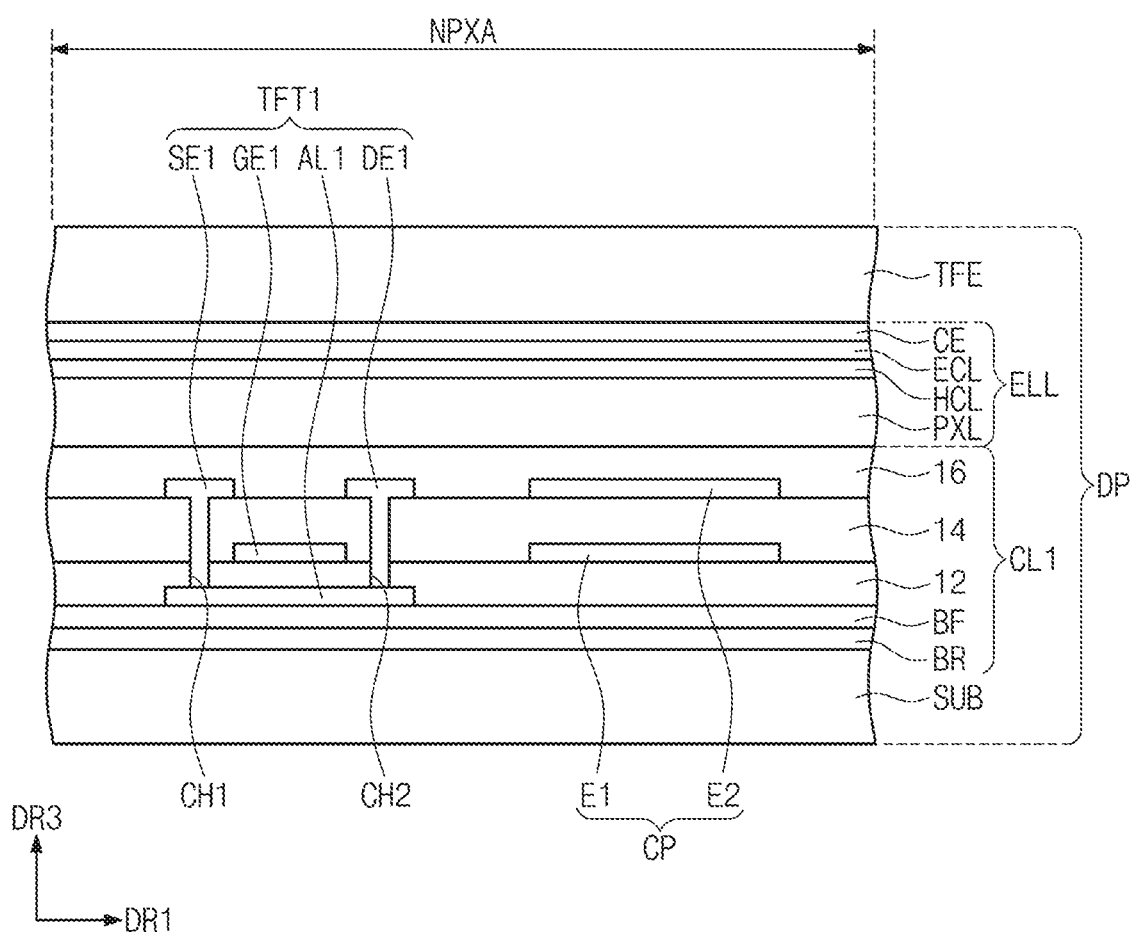
FIG. 6 and FIG. 7 are partial cross-sectional views of the display panel according to an exemplary embodiment.
Figure 7:
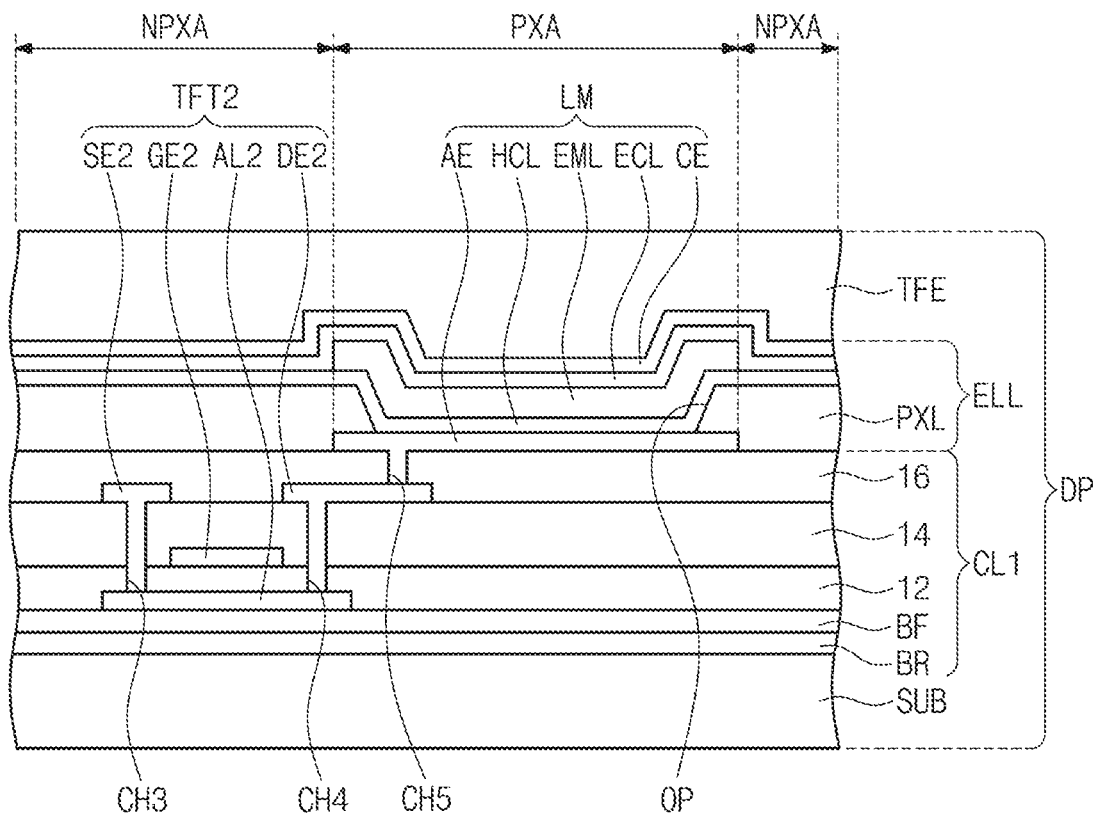

FIG. 4 is a plan view of the display panel DP according to an exemplary embodiment. FIG. 5 is an equivalent circuit diagram of a pixel PX according to an exemplary embodiment. FIGS. 6 and 7 are partial cross-sectional views of the display panel DP according to an exemplary embodiment.

As illustrated in FIG. 4, the display panel DP includes a display area DA and a non-display area NDA on a plane. The display area DA and the non-display area NDA of the display panel DP may correspond to the display area DD-DA (see FIG. 1) and the non-display area DD-NDA (see FIG. 1) of the display device DD (see FIG. 1), respectively. It is unnecessary that the display area DA and the non-display area NDA of the display panel DP respectively correspond to the display area DD-DA (see FIG. 1) and the non-display area DD-NDA (see FIG. 1) of the display module DM. For example, the display area DA and the non-display area NDA of the display panel DP may be changed according to a structure/design of the display panel DP.

The display panel DP may include a plurality of signal lines SGL and a plurality of pixels PX. An area on which the plurality of pixels PX are disposed may be defined as the display area DA. In the current exemplary embodiment, the non-display area NDA may be defined along an edge of the display area DA.

The plurality of signal lines SGL includes gate lines GL, data lines DL, a power line PL, and a control signal line CSL. The gate lines GL are connected to corresponding pixels of the plurality of pixels PX, and the data lines DL are connected to corresponding pixels PX of the plurality of pixels PX, respectively. The power line PL is connected to the plurality of pixels PX. A gate driving circuit DCV to which the gate lines GL are connected may be disposed on one side of the non-display area NDA. The control signal line CSL may provide control signals to the gate driving circuit DCV.

Portions of the gate lines GL, the data lines DL, the power lines PL, and the control signal lines CSL may be disposed on the same layer, and other portions may be disposed on layers different from each other. When the signal lines, which are disposed on one layer, of the gate lines GL, the data lines DL, the power lines PL, and the control signal lines CSL are defined as a plurality of first signal lines, the signal lines disposed on one different layer may be defined as a plurality of second signal lines. The signal lines disposed on further another layer may be defined as a plurality of third signal lines.

Each of the gate lines GL, the data lines DL, the power lines PL, and the control signal lines CSL may include a signal line unit and display panel pads PD-DP connected to an end of the signal line unit. The signal line unit may be defined as portions except for the display panel pads PD-DP of each of the gate lines GL, the data lines DL, the power lines PL, and the control signal lines CSL.

The display panel pads PD-DP may be formed through the same process as that for forming transistors that drive the pixels PX. For example, the transistors for driving the display panel pads PD-DP and the pixels PX may be formed through the same low temperature polycrystalline silicon (LTPS) process or low temperature polycrystalline oxide (LTPO) process.

In an exemplary embodiment, the display panel pads PD-DP may include a control pad CSL-P, a data pad DL-P, and a power pad PL-P. Although the gate pad unit is not illustrated, the gate pad unit may overlap the gate driving circuit DCV and be connected to the gate driving circuit DCV. Although not particularly shown, a portion of the non-display area NDA on which the control pad CSL-P, the data pad DL-P, and the power pad PL-P are aligned may be defined as a pad area.

FIG. 5 illustrates an example of a pixel PX connected to one gate line GL, one data line DL, and the power line PL. However, exemplary embodiments are not limited to the configuration of the pixel PX. For example, the pixel PX may use other configurations without departing from the scope of the inventive concepts.

The pixel PX includes a light emitting element as a display element. In an exemplary embodiment, the light emitting element LM may be an organic light emitting diode.

The light emitting element LM may be a top emission-type diode or a bottom emission-type diode. The pixel PX includes a first transistor TFT1 (or a switching transistor), a second transistor TFT2 (or a driving transistor), and a capacitor CP as a circuit unit for driving the light emitting element LM. The light emitting element LM generates light by an electrical signal provided from the transistors TFT1 and TFT2.

The first transistor TFT1 outputs a data signal applied to the data line DL in response to a scanning signal applied to the gate line GL. The capacitor CP charges a voltage corresponding to the data signal received from the first transistor TFT1.

The second transistor TFT2 is connected to the light emitting element LM. The second transistor TFT2 controls driving current flowing through the light emitting element LM to correspond to a charge amount stored in the capacitor CP. The light emitting element LM emits light during a turn-on period of the second transistor TFT2.

FIG. 6 is a cross-sectional view of portions corresponding to the first transistor TFT1 and the capacitor CP of the equivalent circuit of FIG. 5. FIG. 7 is a cross-sectional view of portions corresponding to the second transistor TFT2 and the light emitting element LM of the equivalent circuit of FIG. 5.

As illustrated in FIGS. 6 and 7, the first circuit layer CL1 is disposed on the base layer SUB. The base layer SUB may include a plastic substrate, a glass substrate, a metal substrate, or an organic/inorganic composite substrate as a flexible substrate.

A semiconductor pattern AL1 (hereinafter, referred to as a first semiconductor pattern) of the first transistor TFT1 and a semiconductor pattern AL2 (hereinafter, referred to as a second semiconductor pattern) of the second transistor TFT2 are disposed on the base layer SUB. The first and second semiconductor patterns AL1 and AL2 may be equally or differently selected from amorphous silicon, polysilicon, and a metal oxide semiconductor.

The first circuit layer CL1 includes organic/inorganic layers BR, BF, 12, 14, and 16. The first circuit layer CL1 may include a first transistor TFT1, a second transistor TFT2, and electrodes E1 and E2. The organic/inorganic layers BR, BF, 12, 14, and 16 may include functional layers BR and BF, a first insulation layer 12, a second insulation layer 14, and a third insulation layer 16.

The functional layers BR and BF may be disposed on one surface of the base layer SUB. The functional layers BR and BF may include at least one of a barrier layer BR or a buffer layer BF. The first and second semiconductor patterns AL1 and AL2 may be disposed on the barrier layer BR or the buffer layer BF.

The first insulation layer 12 covering the first and second semiconductor patterns AL1 and AL2 is disposed on the base layer SUB. The first insulation layer 12 includes an organic layer and/or an inorganic layer. Particularly, the first insulation layer 12 may include a plurality of inorganic thin films. The plurality of inorganic thin films may include a silicon nitride layer, a silicon oxynitride layer, and a silicon oxide layer.

A control electrode GE1 (hereinafter, referred to as a first control electrode) of the first transistor TFT1 and a control electrode GE2 (hereinafter, referred to as a second control electrode) of the second transistor TFT2 are disposed on the first insulation layer 12. A first electrode E1 of the capacitor CP is disposed on the first insulation layer 12. The first control electrode GE1, the second control electrode GE2, and the first electrode E1 may be manufactured by the same photolithograph process as that of the gate lines (see reference numeral GL of FIG. 4). That is, the first electrode E1 may be formed of the same material as the gate lines GL, have the same laminated structure as the gate lines GL, and be disposed on the same layer as the gate lines GL.

A second insulation layer 14 covering the first and second control electrodes GE1 and GE2 and the first electrode E1 is disposed on the first insulation layer 12. The second insulation layer 14 includes an organic layer and/or an inorganic layer. Particularly, the second insulation layer 14 may include a plurality of inorganic thin films. The plurality of inorganic thin films may include a silicon nitride layer, a silicon oxynitride layer, and a silicon oxide layer.

The data lines DL (see FIG. 4) may be disposed on the second insulation layer 14. An input electrode SE1 (hereinafter, referred to as a first input electrode) and an output electrode DE1 (hereinafter, referred to as a first output electrode) of the first transistor TFT1 are disposed on the second insulation layer 14. An input electrode SE2 (hereinafter, referred to as a second input electrode) and an output electrode DE2 (hereinafter, referred to as a second output electrode) of the second transistor TFT2 are disposed on the second insulation layer 14. The first input electrode SE1 is branched from a corresponding data line of the data lines DL. The power line PL (see FIG. 4) may be disposed on the same layer as the data lines DL. The second input electrode SE2 may be branched from the power line PL.

A second electrode E2 of the capacitor CP is disposed on the second insulation layer 14. The second electrode E2 may be manufactured by the same photolithograph process as that of each of the data line DL and the power line PL. Also, the second electrode E2 may be formed of the same material, have the same structure, and be disposed on the same layer as that of each of the data line DL and the power line PL.

The first input electrode SE1 and the first output electrode DE1 are connected to the first semiconductor pattern AL1 through first and second through holes CH1 and CH2, which pass through the first and second insulation layers 12 and 14, respectively. The first output electrode DE1 may be electrically connected to the first electrode E1. For example, the first output electrode DE1 may be connected to the first electrode E1 through a through hole (not shown) passing through the second insulation layer 14. The second input electrode SE2 and the second output electrode DE2 are connected to the second semiconductor pattern AL2 through third and fourth through holes CH3 and CH4, which pass through the first and second insulation layers 12 and 14, respectively. According to another exemplary embodiment, each of the first and second transistors TFT1 and TFT2 may alternately be formed as a bottom gate structure.

A third insulation layer 16 covering the first input electrode SE1, the first output electrode DE1, the second input electrode SE2, and the second output electrode DE2 is disposed on the second insulation layer 14. The third insulation layer 16 includes an organic layer and/or an inorganic layer. Particularly, the third insulation layer 16 may include an organic material to provide a flat surface.

One of the first, second, and third insulation layers 12, 14, and 16 may be omitted according to the circuit structure of the pixel. Each of the second and third insulation layers 14 and 16 may be defined as an interlayer dielectric layer. The interlayer dielectric layer may be disposed between a lower conductive pattern, which is disposed under the interlayer dielectric layer, and an upper conductive pattern, which is disposed above the interlayer dielectric layer, to insulate the conductive patterns from each other.

The first circuit layer CL1 includes dummy conductive patterns. The dummy conductive patterns are disposed on the same layer as the semiconductor patterns AL1 and AL2, the control electrodes GE1 and GE2, or the output electrodes DE1 and DE2. The dummy conductive patterns may be disposed on the non-display area NDA (see FIG. 4). The dummy conductive patterns will be described later in detail.

The light emitting element layer ELL is disposed on the third insulation layer 16. The light emitting element layer ELL may include the light emitting elements LM.

A pixel defining layer PXL and the light emitting element LM are disposed on the third insulation layer 16. An anode AE is disposed on the third insulation layer 16. The anode AE is connected to the second output electrode DE2 through a fifth through hole CH5 passing through the third insulation layer 16. An opening OP is defined in the pixel defining layer PXL. The opening OP of the pixel defining layer PXL exposes at least a portion of the anode AE.

The light emitting element layer ELL may include an emission area PXA and a non-emission area NPXA that is adjacent to the emission area PXA. The non-emission area NPXA may surround the emission area PXA. In the current embodiment, the emission area PXA is defined to correspond to the anode AE. However, exemplary embodiments are not limited to the above-described emission area PXA. That is, if light is emitted from an area, the area may be defined as the emission area PXA. The emission area PXA may be defined to correspond to a portion of the anode AE, which is exposed by the opening OP.

A hole control layer HCL may be commonly disposed on the emission area PXA and the non-emission area NPXA. Although not particularly shown, a common layer such as the hole control layer HCL may be commonly disposed on the plurality of pixels PX (see FIG. 4).

An organic light emitting layer EML is disposed on the hole control layer HCL. The organic light emitting layer EML may be disposed on an area corresponding to the opening OP. That is, the organic light emitting layer EML may be separated from each of the plurality of pixels PX.

An electronic control layer ECL is disposed on the organic light emitting layer EML. A cathode CE is disposed on the electronic control layer ECL. The cathode CE is commonly disposed on the plurality of pixels PX.

Although the patterned organic light emitting layer EML is illustrated as an example in the current exemplary embodiment, the organic light emitting layer EML may be commonly disposed on the plurality of pixels PX. Here, the organic light emitting layer EML may emit white light. Also, the organic light emitting layer EML may have a multilayer structure. The organic light emitting layer EML may include an organic material or an inorganic material.

The thin film encapsulation layer TFE seals the light emitting element layer ELL. The thin film encapsulation layer TFE may include at least two inorganic thin films and an organic thin film disposed between the at least two inorganic thin films. The thin film encapsulation layer TFE may protect the light emitting element layer ELL against foreign substances such as moisture and dust particles.

In an exemplary embodiment, the thin film encapsulation layer TFE directly covers the cathode CE. The thin film encapsulation layer TFE may include an organic layer including an organic material and an inorganic layer including an inorganic material.

Referring to FIGS. 3 and 6, the sensing layer TS may be disposed on the thin film encapsulation layer TFE to sense user's touch. In an exemplary embodiment, the sensing layer TS may be a single layer. That is, the sensing layer TS may include a single conductive layer. Here, the single conductive layer means that "a conductive layer divided by an insulation layer is provided in one". A laminated structure of a first metal layer/a second metal layer/a metal oxide layer may correspond to a signal conductive layer, and a laminated structure of a first meal layer/an insulation layer/a metal oxide layer may correspond to a double conductive layer.

The single conductive layer may be patterned to form a plurality of touch electrodes and a plurality of touch signal lines. That is, the sensors of the sensing layer TS may be disposed on the same layer. The sensors may be directly disposed on the thin film encapsulation layer TFE. Also, a portion of each of the touch signal lines may be disposed on the same layer as the sensors. A portion of each of the touch signal lines may be disposed on the first circuit layer CL1.

Each of the touch signal lines and the sensors may include indium tin oxide (ITO), indium zinc oxide (IZO), zinc oxide (ZnO), or indium tin zinc oxide (ITZO), PEDOT, a metal Nano wire, and graphene. Each of the touch signal lines and the sensors may include a metal layer, for example, molybdenum, silver, titanium, copper, aluminum, and an alloy thereof. The touch signal lines and the sensors may include the same material or materials different from each other.

Referring to FIG. 3, the display module DM according to an exemplary embodiment may include a single layer-type sensing member to simplify a structure thereof when compared to that of a display module DM including a multilayer-type sensing member. Although the display module DM is bent as illustrated in FIGS. 2A to 2E, stress generated in the sensing layer TS may be reduced. This is done because the sensing layer TS is slim.

Figure 8:
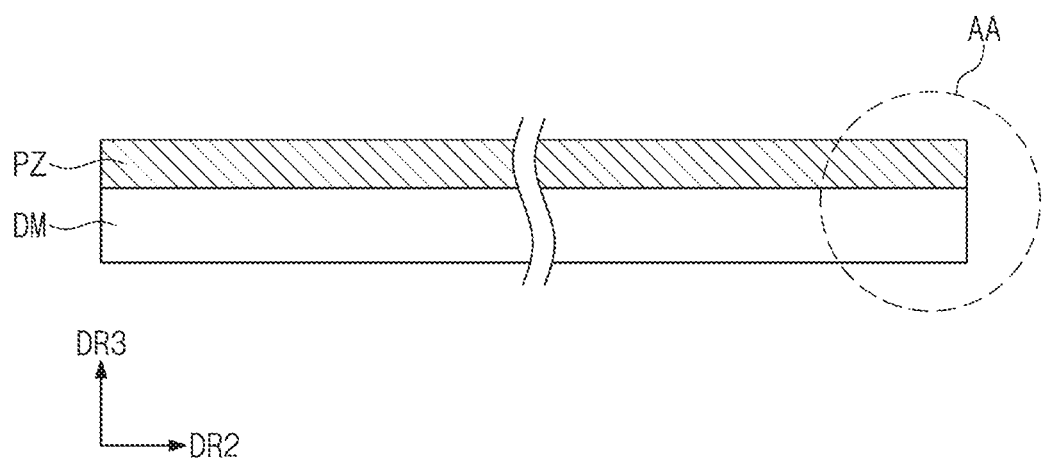
FIG. 8 is a cross-sectional view of a display module and an anti-reflection member according to an exemplary embodiment.

FIG. 8 is a cross-sectional view of the display module DM and the anti-reflection member PZ according to an exemplary embodiment. FIGS. 9A to 9E are enlarged views of a portion AA of FIG. 8. The display module DM and the anti-reflection member PZ can be adhered by an adhesive member. The adhesive member may have an adhesive force.

Figure 9A:
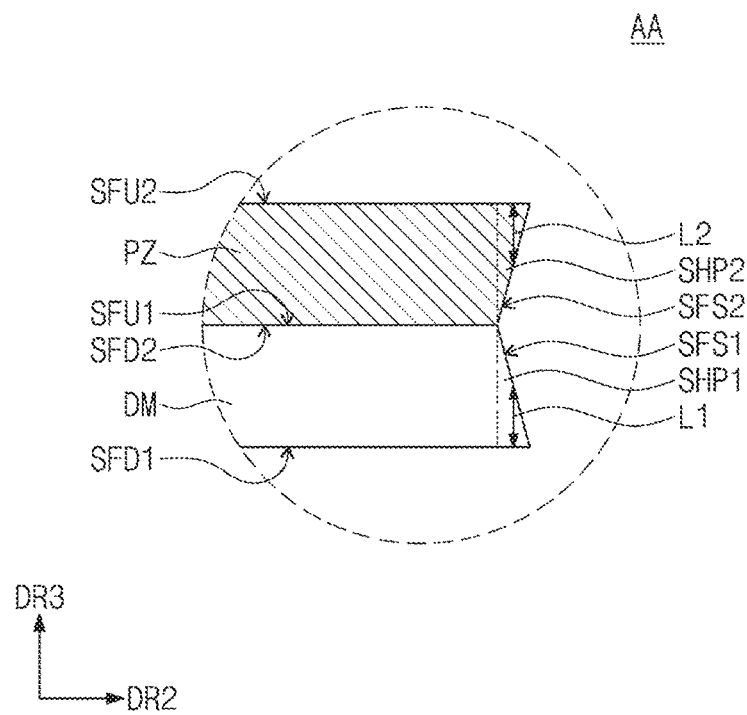
FIG. 9A, FIG. 9B, FIG. 9C, FIG. 9D, and FIG. 9E are enlarged views of a portion AA of FIG. 8.

Referring to FIG. 9A, one side of the display module DM in the cross-section has a first shape SHP1. A first thickness L1 is obtained by measuring a thickness of the first shape SHP1 in the third direction DR3, the first thickness L1 may gradually decrease outward in the second direction DR2.

The display module DM may include a first top surface SFU1, a first side surface SFS1, and a first bottom surface SFD1. The first top surface SFU1 may be a surface that is adjacent to the anti-reflection member PZ. The first side surface SFS1 forms an obtuse angle together with the first top surface SFU1 and extends from the first top surface SFU1. The first bottom surface SFD1 is substantially parallel to the first top surface SFU1 and extends from the first side surface SFS1. In an exemplary embodiment, the first shape SHP1 may be a triangular shape that is defined by the first side surface SFS1 and the first bottom surface SFD1.

One side of the anti-reflection member PZ in the cross-section has a second shape SHP2. A second thickness L2 is obtained by measuring a thickness of the second shape SHP2 in the third direction DR3, the second thickness L2 may gradually decrease outward in the second direction DR2.

The anti-reflection member PZ may include a second top surface SFD2, a second side surface SFS2, and a second bottom surface SFD2. The second bottom surface SFD2 may be a surface that is adjacent to the display module DM. The second side surface SFS2 forms an obtuse angle together with the second bottom surface SFD2 and extends from the second bottom surface SFD2. The second top surface SFU2 is parallel to the second bottom surface SFD2 and extends from the second side surface SFS2. In an exemplary embodiment, the second shape SHP2 may be a triangular shape that is defined by the second side surface SFS2 and the second top surface SFU2.

Thus, in an exemplary embodiment, a side surface of an assembly of the anti-reflection member PZ and the display module DM may have a wedge shape or a valley shape.

Figure 9B:
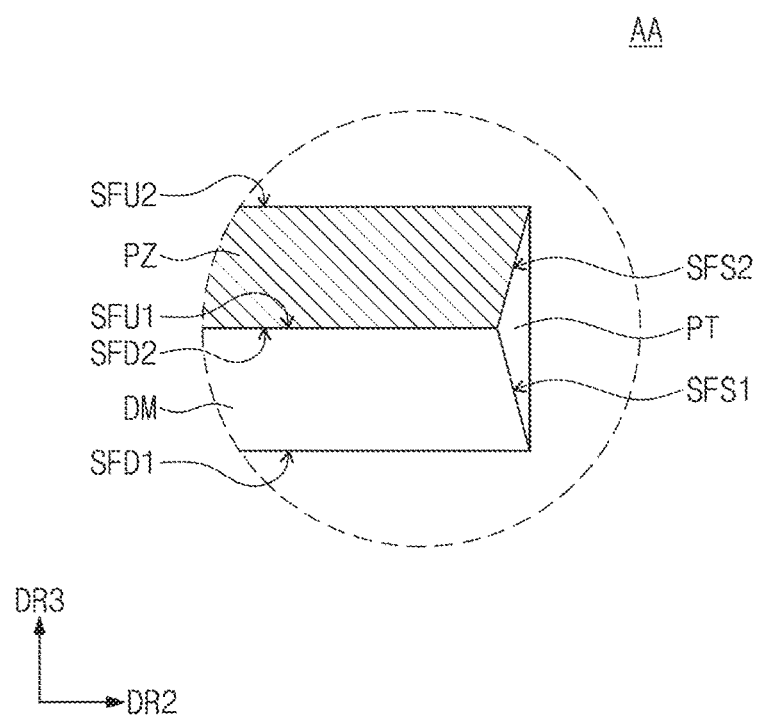

Referring to FIG. 9B, a side surface protection member PT may be disposed on one side of the display module DM. The side surface protection member PT may be disposed adjacent to the first side surface SFS1 and the second side surface SFS2. The side surface protection member PT may be attached in a film shape. In another exemplary embodiment, the side surface protection member PT may be formed by curing a liquid material. The liquid material may include acryl, and a method for curing the liquid material may include a thermosetting method or an UV-curing method.

Since the one side of each of the display module DM and the anti-reflection member PZ in the cross-section has the shape illustrated in FIGS. 9A and 9B, the first top surface SFU1 or the second bottom surface SFD2 are not exposed to the outside. Thus, the delamination on the side surfaces may be prevented.

Figure 9C:
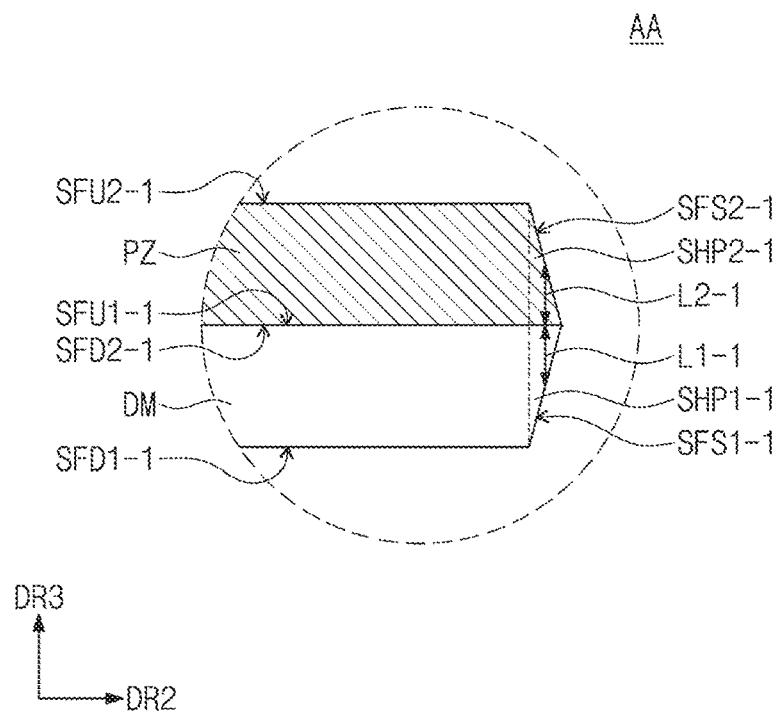

Referring to FIG. 9C, one side of the display module DM in the cross-section has a first shape SHP1-1. A first thickness L1-1 is obtained by measuring a thickness of the first shape SHP1-1 in the third direction DR3, the first thickness L1-1 may gradually decrease outward in the second direction DR2.

The display module DM may include a first top surface SFU1-1, a first side surface SFS1-1, and a first bottom surface SFD1-1. The first top surface SFU1-1 may be a surface that is adjacent to the anti-reflection member PZ. The first side surface SFS1-1 forms an acute angle together with the first top surface SFU1-1 and extends from the first top surface SFU1-1. The first bottom surface SFD1-1 is substantially parallel to the first top surface SFU1-1 and extends from the first side surface SFS1-1. In an exemplary embodiment, the first shape SHP1-1 may have a triangular shape that is defined by the first side surface SFS1-1 and the first top surface SFU1-1.

One side of the anti-reflection member PZ in the cross-section has a second shape SHP2-1. A second thickness L2-1 is obtained by measuring a thickness of the second shape SHP2-1 in the third direction DR3, the second thickness L2-1 may gradually decrease outward in the second direction DR2.

The anti-reflection member PZ may include a second top surface SFU2-1, a second side surface SFS2-1, and a second bottom surface SFD2-1. The second bottom surface SFD2-1 may be a surface that is adjacent to the display module DM. The second side surface SFS2-1 forms an acute angle together with the second bottom surface SFD2-1 and extends from the second bottom surface SFD2-1. The second top surface SFU2-1 is parallel to the second bottom surface SFD2-1 and extends from the second side surface SFS2-1. In an exemplary embodiment, the second shape SHP2-1 may be a triangular shape that is defined by the second side surface SFS2-1 and the second bottom surface SFD2-1.

Figure 9D:
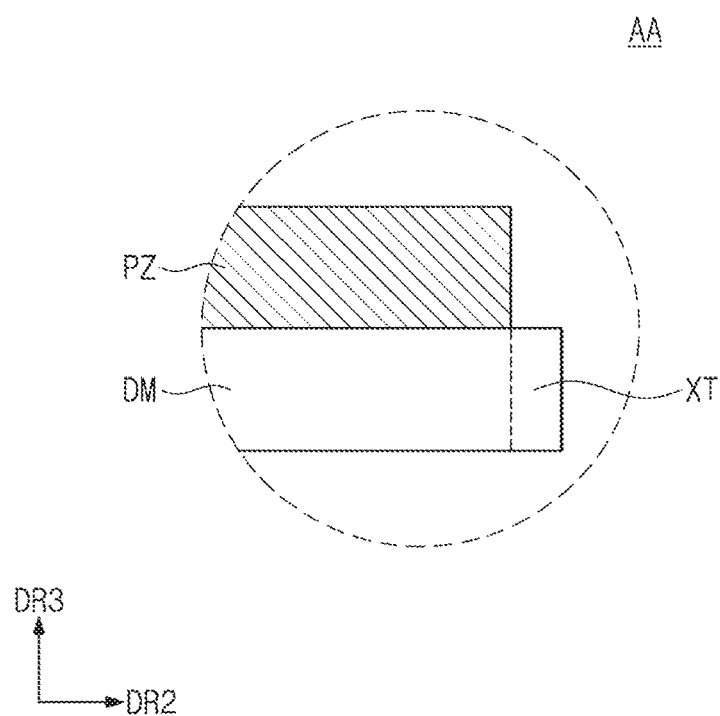
Figure 9E:
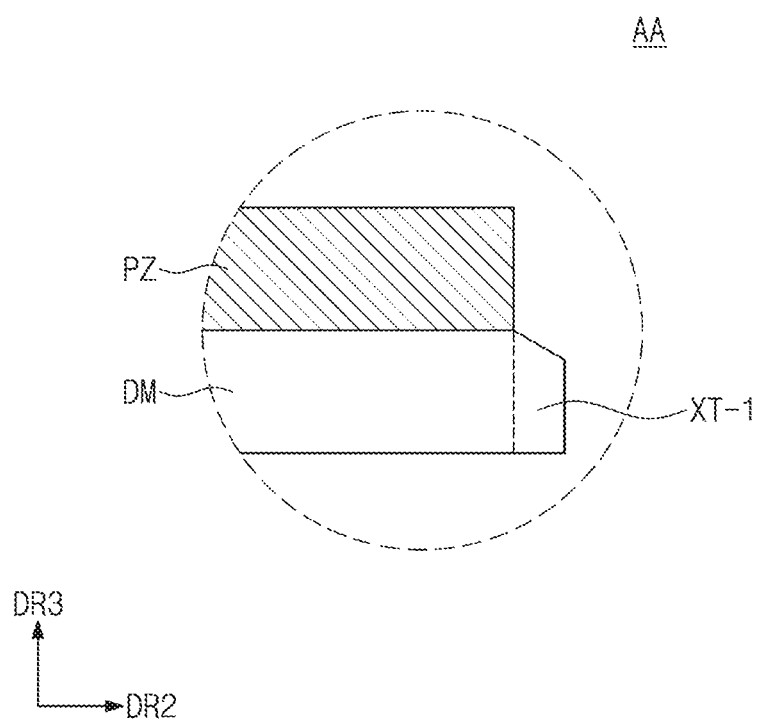

Referring to FIG. 9D and FIG. 9E, the anti-reflection member PZ and the display module DM may be attached to each other with a stepped portion on the side surface. In FIG. 9D, a protrusion XT of the display module DM may not overlap the anti-reflection member PZ and have a rectangular shape in cross-section. In FIG. 9E, a protrusion XT-1 of the display module DM may not overlap the anti-reflection member PZ and have a trapezoid shape in cross-section, but do not have the rectangular shape. The cross-section of the protrusion XT-1 may have a shape that gradually decreases in thickness outward in the second direction DR2.

Figure 10A:
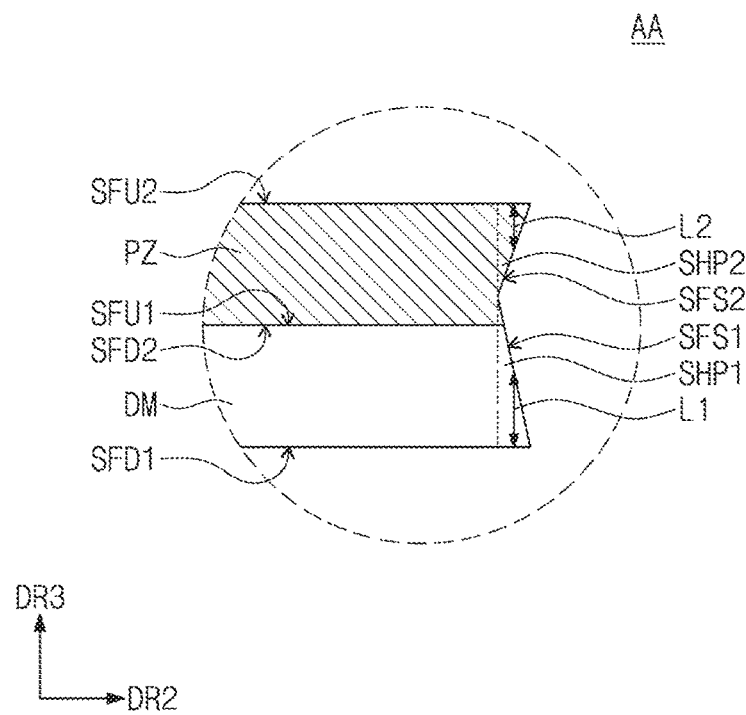
FIG. 10A and FIG. 10B are enlarged views of the portion AA of FIG. 8.
Figure 10B:
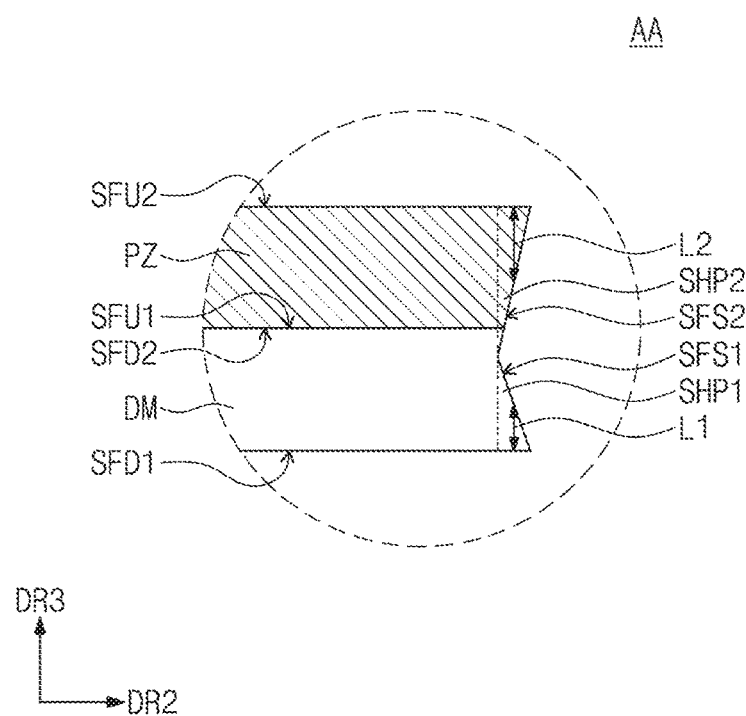

FIG. 10A and FIG. 10B are enlarged views of the portion AA of FIG. 8.

Referring to FIG. 10A, in an exemplary embodiment, the first side surface SFS1 and the second side surface SFS2 may contact each other above the second bottom surface SFD2.

Referring to FIG. 10B, in an exemplary embodiment, the first side surface SFS1 and the second side surface SFS2 may contact each other below the first top surface SFU1.

Referring to FIG. 10A and FIG. 10B, in an exemplary embodiment, an assembly may include the anti-reflection member PZ and the display module DM. The point at which the first side surface SFS1 and the second side surface SFS2 contact each other may be a portion of the assembly, which has the largest adhesion force between the layers, anti-reflection member PZ and the display module DM in this example, constituting the assembly.

In an exemplary embodiment, the point at which the first side surface SFS1 and the second side surface SFS2 contact each other may be a portion of the first circuit layer CL1 of FIG. 6, which has the largest adhesion force between the layers shown in FIG. 6.

In another exemplary embodiment, the point at which the first side surface SFS1 and the second side surface SFS2 contact each other may be a portion of the base layer SUB of FIG. 6, which has the largest adhesion force between the layers shown in FIG. 6.

As illustrated in FIGS. 10A and 10B, a shape of a portion AA of FIG. 8 may be altered by an error due to a manufacturing process, a laminated structure of the display module DM and the anti-reflection member PZ, or a shape of a cutting member.

Figure 11:
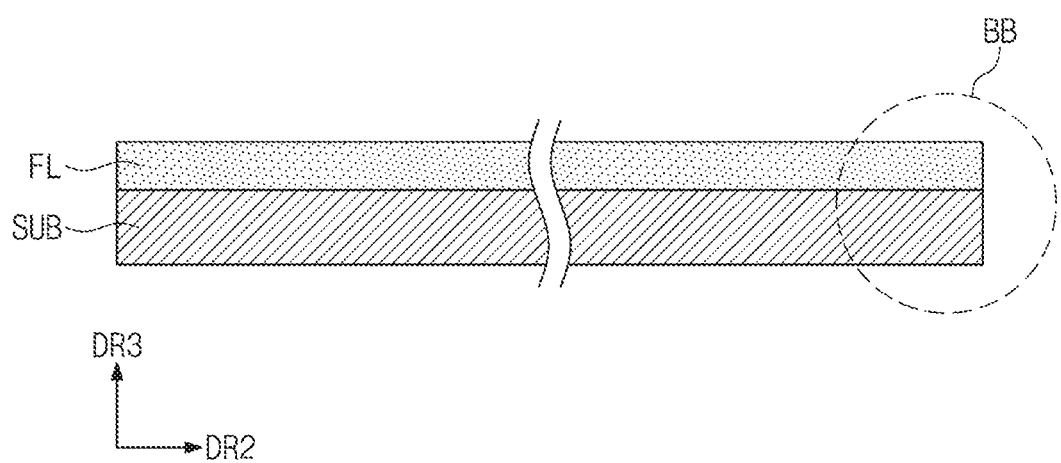
FIG. 11 is a cross-sectional view of a base layer and a functional layer according to an exemplary embodiment.

FIG. 11 is a cross-sectional view of a base layer SUB and a functional layer FL according to an exemplary embodiment. FIGS. 12A to 12E are enlarged views of a portion BB of FIG. 11.

The functional layer FL may include at least one of a barrier layer BR (see FIG. 6), a buffer layer BF (see FIG. 6), the thin film encapsulation layer TFE, the touch sensing layer TS (see FIG. 3), the anti-reflection member PZ (see FIG. 3), or the window WM (see FIG. 3).

Figure 12A:
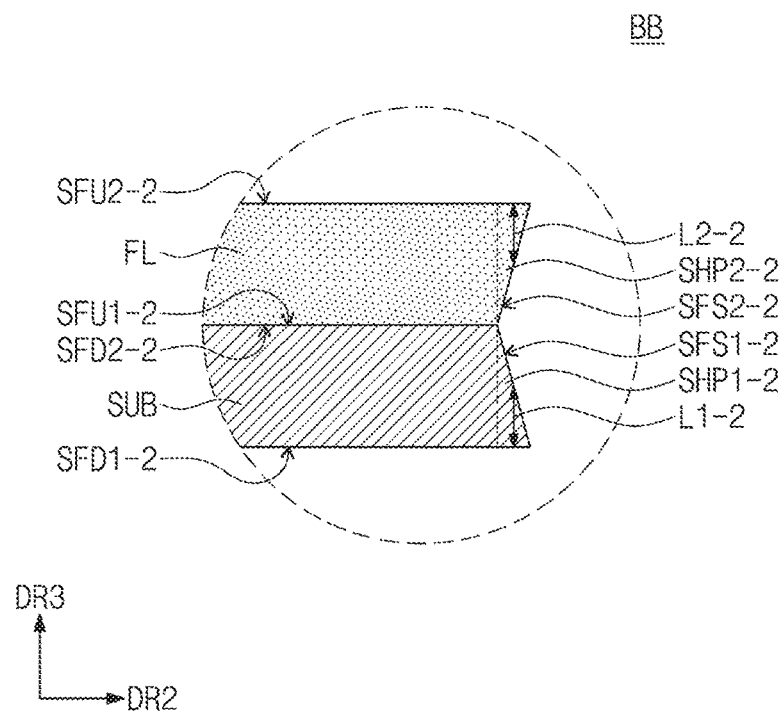
FIG. 12A, FIG. 12B, FIG. 12C, FIG. 12D, and FIG. 12E are enlarged views of a portion BB of FIG. 11.

Referring to FIG. 12A, one side of the base layer SUB in a cross-section has a first shape SHP1-2. A first thickness L1-2 is obtained by measuring a thickness of the first shape SHP1-2 in the third direction DR3, the first thickness L1-2 may gradually decrease outward in the second direction DR2.

The base layer SUB may include a first top surface SFU1-2, a first side surface SFS1-2, and a first bottom surface SFD1-2. The first top surface SFU1-2 may be a surface that is adjacent to the functional layer FL. The first side surface SFS1-2 forms an obtuse angle together with the first top surface SFU1-2 and extends from the first top surface SFU1-2. The first bottom surface SFD1-2 is substantially parallel to the first top surface SFU1-2 and extends from the first side surface SFS1-2. In an exemplary embodiment, the first shape SHP1-2 may be a triangular shape that is defined by the first side surface SFS1-2 and the first bottom surface SFD1-2.

One side of the functional layer FL in the cross-section has a second shape SHP2-2. A second thickness L2-2 is obtained by measuring a thickness of the second shape SHP2-2 in the third direction DR3, the second thickness L2-2 may gradually decrease outward in the second direction DR2.

The functional layer FL may include a second top surface SFU2-2, a second side surface SFS2-2, and a second bottom surface SFD2-2. The second bottom surface SFD2-2 may be a surface that is adjacent to the base layer SUB. The second side surface SFS2-2 forms an obtuse angle together with the second bottom surface SFD2-2 and extends from the second bottom surface SFD2-2. The second top surface SFU2-2 is parallel to the second bottom surface SFD2-2 and extends from the second side surface SFS2-2. In an exemplary embodiment, the second shape SHP2-2 may be a triangular shape that is defined by the second side surface SFS2-2 and the second top surface SFU2-2.

Thus, in an exemplary embodiment, a side surface of an assembly of the functional layer FL and the base layer SUB may have a wedge shape or a valley shape.

Figure 12B:
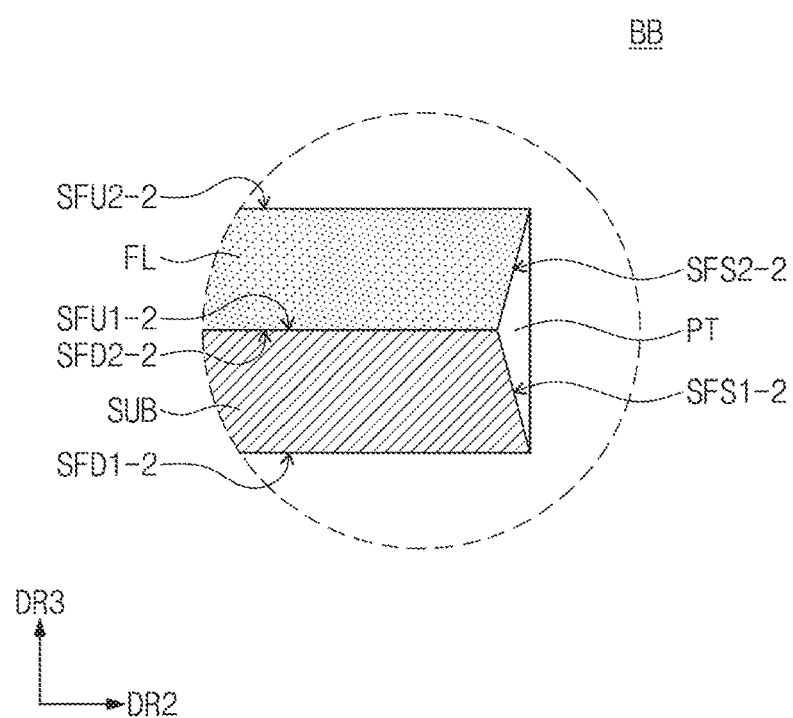

Referring to FIG. 12B, a side surface protection member PT may be disposed on one side of the base layer SUB and the functional layer FL. Descriptions of the side surface protection member PT are the same as those with reference to FIG. 9B and thus will be omitted.

Since the one side of each of the base layer SUB and the functional layer FL in the cross-section has the shape illustrated in FIGS. 12A and 12B, the first top surface SFU1-2 or the second bottom surface SFD2-2 are not exposed to the outside. Thus, the delamination on the side surfaces may be prevented.

Figure 12C:
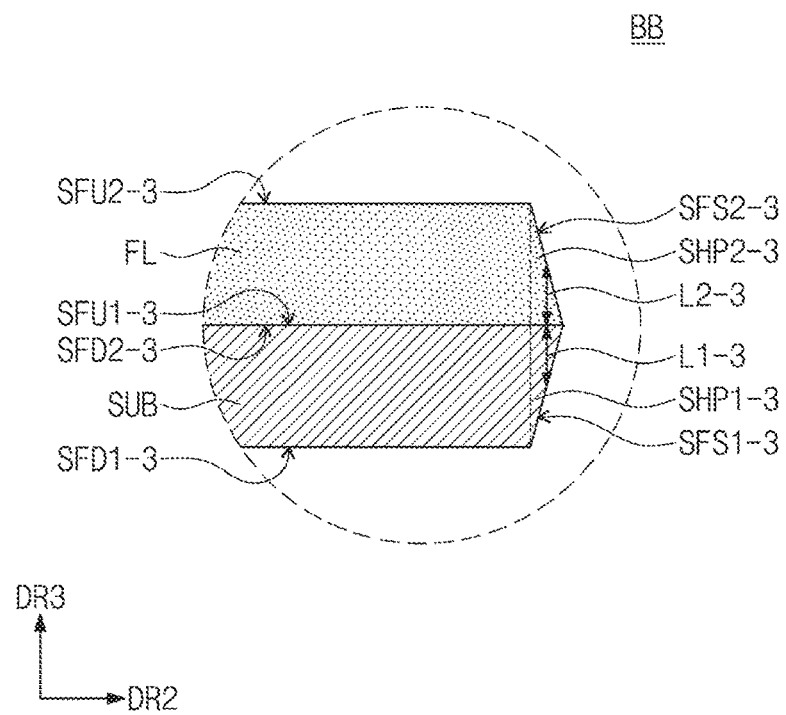

Referring to FIG. 12C, one side of the base layer SUB in a cross-section has a first shape SHP1-3. A first thickness L1-3 is obtained by measuring a thickness of the first shape SHP1-3 in the third direction DR3, and the first thickness L1-3 may gradually decrease outward in the second direction DR2.

The base layer SUB may include a first top surface SFU1-3, a first side surface SFS1-3, and a first bottom surface SFD1-3. The first top surface SFU1-3 may be a surface that is adjacent to the functional layer FL. The first side surface SFS1-3 forms an acute angle together with the top surface SFU1-3 and extends from the first top surface SFU1-3. The first bottom surface SFD1-3 is substantially parallel to the first top surface SFU1-3 and extends from the first side surface SFS1-3. In an exemplary embodiment, the first shape SHP1-3 may be a triangular shape that is defined by the first side surface SFS1-3 and the first top surface SFU1-3.

One side of the functional layer FL in the cross-section has a second shape SHP2-3. A second thickness L2-3 is obtained by measuring a thickness of the second shape SHP2-3 in the third direction DR3, the second thickness L2-3 may gradually decrease outward in the second direction DR2.

The functional layer FL may include a second top surface SFU2-3, a second side surface SFS2-3, and a second bottom surface SFD2-3. The second bottom surface SFD2-3 may be a surface that is adjacent to the base layer SUB. The second side surface SFS2-3 forms an acute angle together with the second bottom surface SFD2-3 and extends from the second bottom surface SFD2-3. The second top surface SFU2-3 is parallel to the second bottom surface SFD2-3 and extends from the second side surface SFS2-3. In an exemplary embodiment, the second shape SHP2-3 may have a triangular shape that is defined by the second side surface SFS2-3 and the second bottom surface SFD2-3.

Figure 12D:
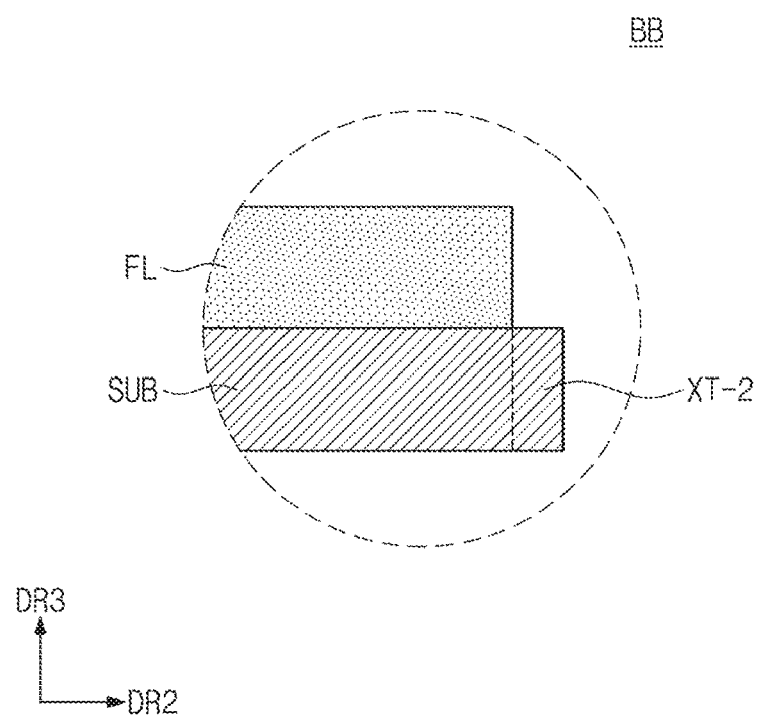
Figure 12E:
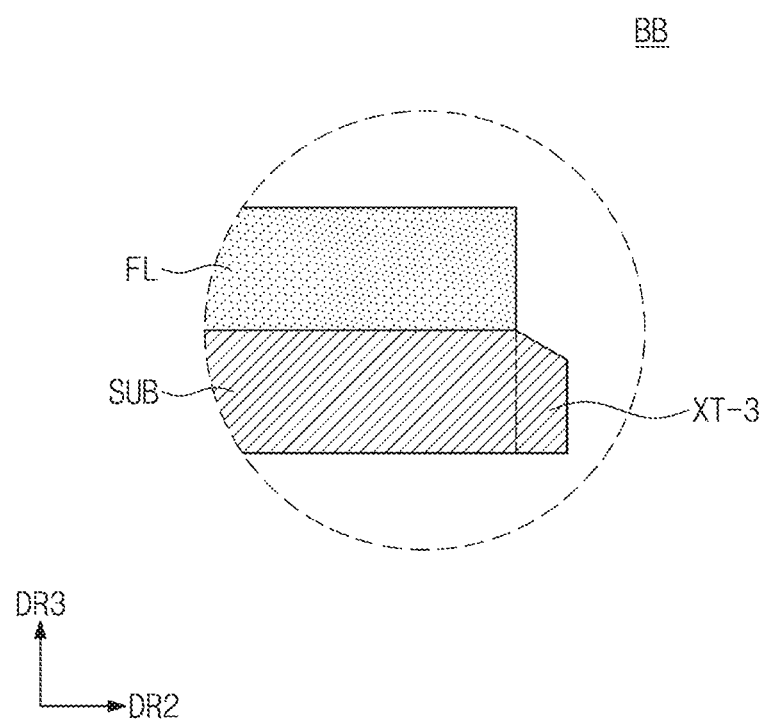

Referring to FIG. 12D and FIG. 12E, the functional layer FL and the base layer SUB may be attached to each other with a stepped portion on the side surface. In FIG. 9D, a protrusion XT-2 of the base layer SUB may not overlap the functional layer FL and have a rectangular shape in cross-section. In FIG. 9E, a protrusion XT-3 of the base layer SUB may not overlap the functional layer FL and have a trapezoid shape in cross-section, but do not have the rectangular shape. The cross-section of the protrusion XT-3 may have a shape that gradually decreases in thickness outward in the second direction DR2.

Figure 13A:
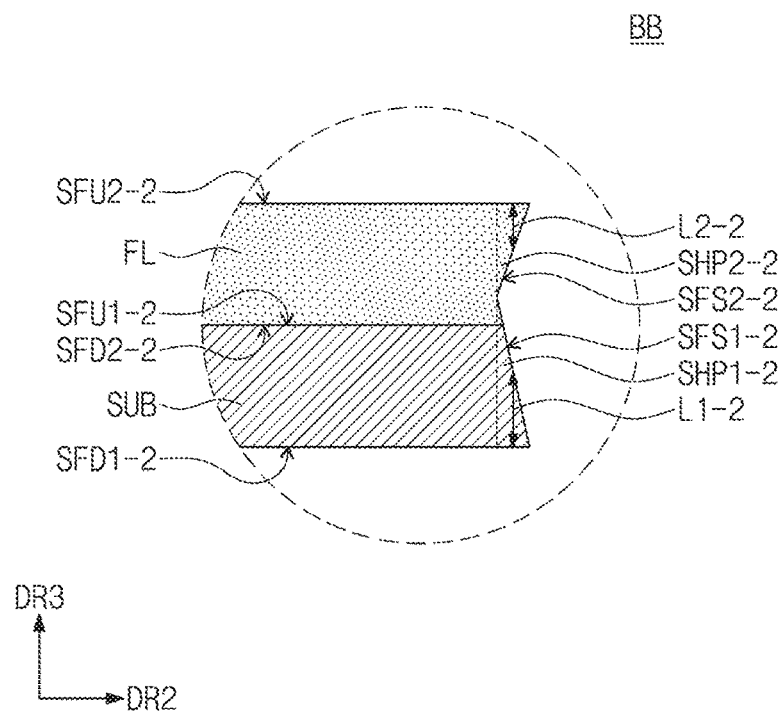
FIG. 13A and FIG. 13B are enlarged views of the portion BB of FIG. 11.
Figure 13B:
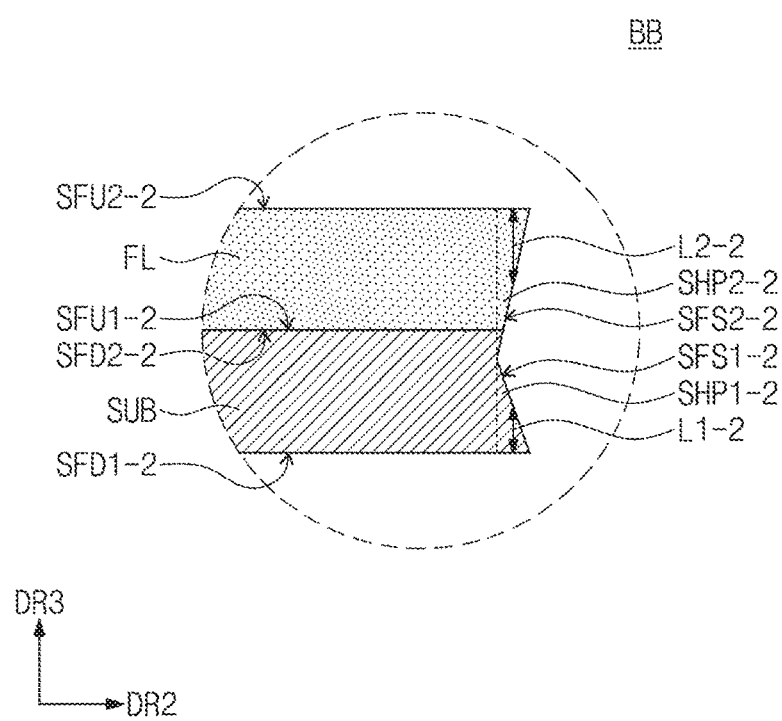

FIGS. 13A and 13B are enlarged views of the portion BB of FIG. 11.

Referring to FIG. 13A, in an exemplary embodiment, the first side surface SFS1-2 and the second side surface SF S2-2 may contact each other above the second bottom surface SFD2-2.

Referring to FIG. 13B, in an exemplary embodiment, the first side surface SFS1-2 and the second side surface SFS2-2 may contact each other below the first top surface SFU1-2.

As illustrated in FIGS. 13A and 13B, a shape of a portion BB of FIG. 11 may be altered by an error due to a manufacturing process, a laminated structure of the display module DM and the anti-reflection member PZ, or a shape of a cutting member.

The side surfaces of the display module DM and the anti-reflection member PZ may have shapes different from each other. One side surface of each of the display module DM and the anti-reflection member PZ may have one of the shapes of FIGS. 9A to 10B, and the other side surface of each of the display module DM and the anti-reflection member PZ may have the other one of the shapes of FIGS. 9A to 10B.

The side surfaces of the base layer SUB and the functional layer FL may have shapes different from each other. One side surface of each of the base layer SUB and the functional layer FL may have one of the shapes shown in FIGS. 12A to 13B, and the other side surface of each of the base layer SUB and the functional layer FL may have the other one of the shapes shown in FIGS. 12A to 13B.

Figure 14:
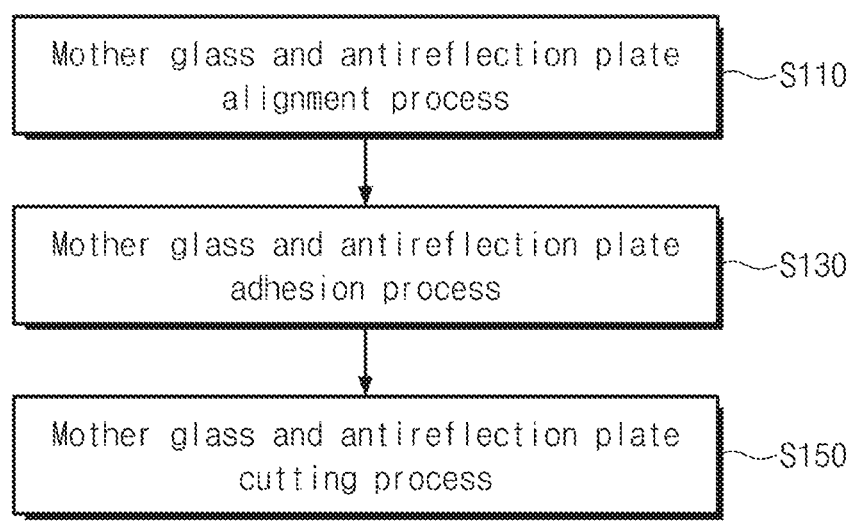
FIG. 14 is a flowchart illustrating a method for manufacturing the display device according to an exemplary embodiment.

FIG. 14 is a flowchart illustrating a method for manufacturing the display device DD according to an exemplary embodiment. FIGS. 15 to 21 are plan views illustrating an alignment process and an adhesion process in FIG. 14. FIGS. 22A to 26B are cross-sectional views illustrating a cutting process of FIG. 14 according to an exemplary embodiment.

A method for manufacturing the display device DD (see FIG. 1) may include an alignment process (S110), an adhesion process (S130), and a cutting process (S150).

Figure 15:
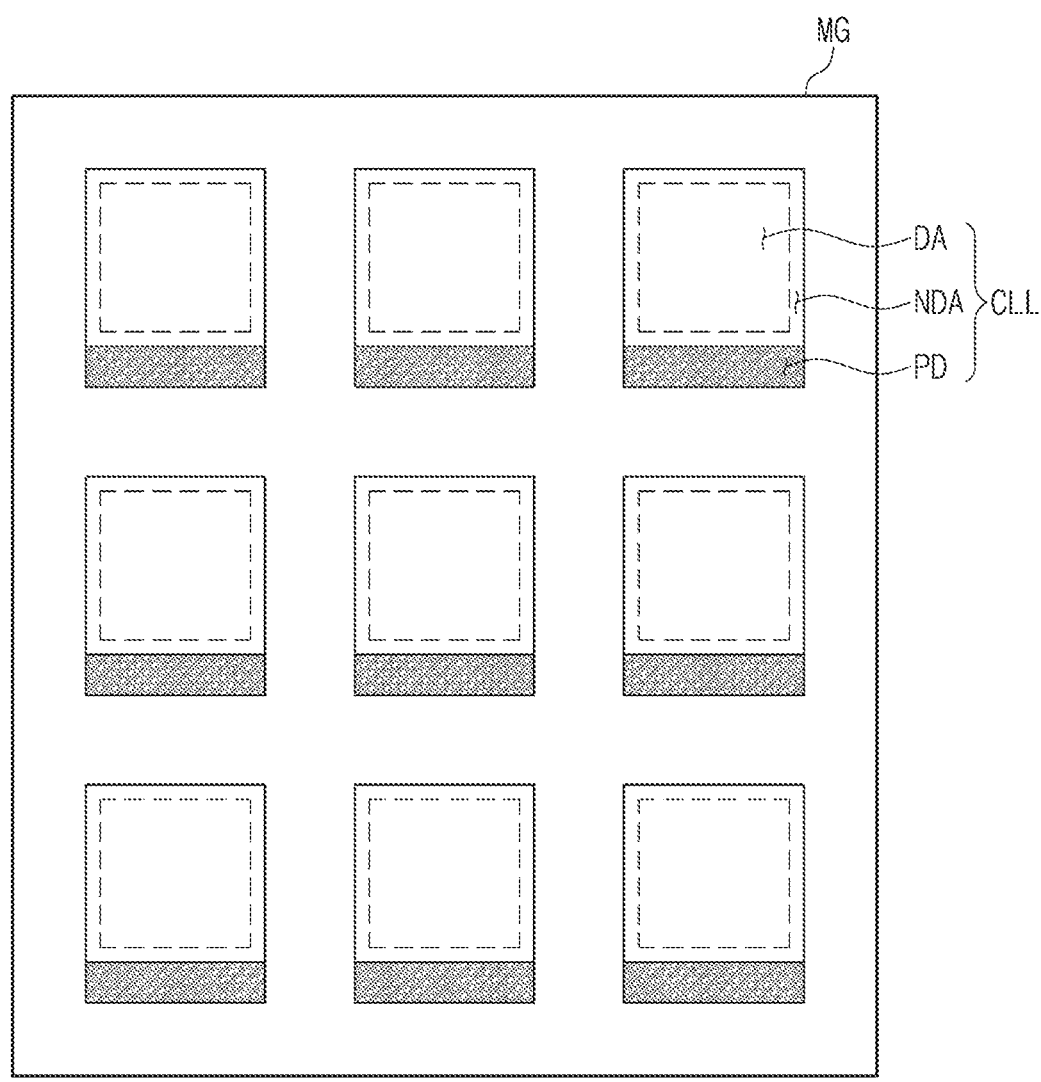
FIG. 15, FIG. 16, and FIG. 17 are plan views illustrating an alignment process and an adhesion process in FIG. 14.
Figure 16:
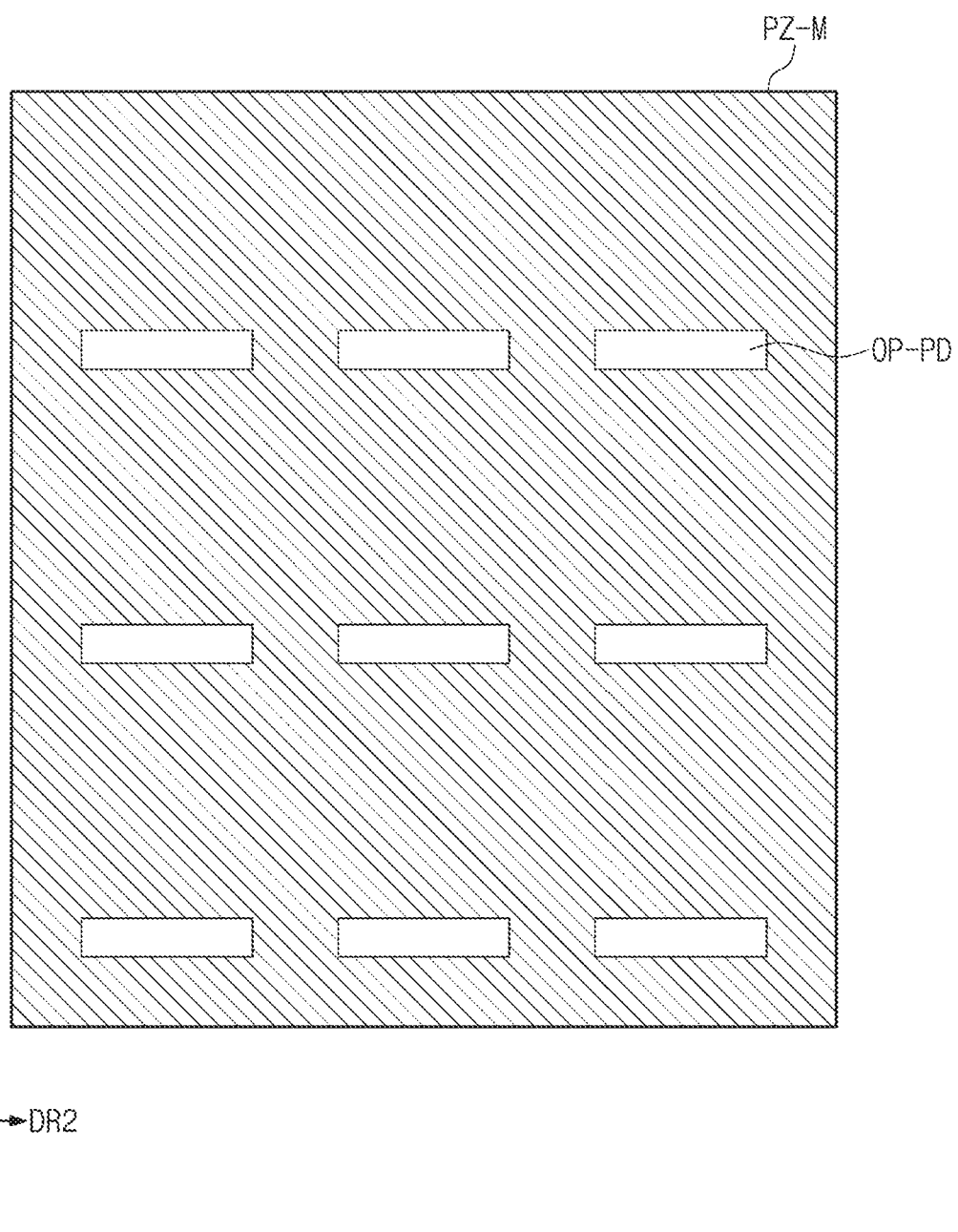
Figure 17:
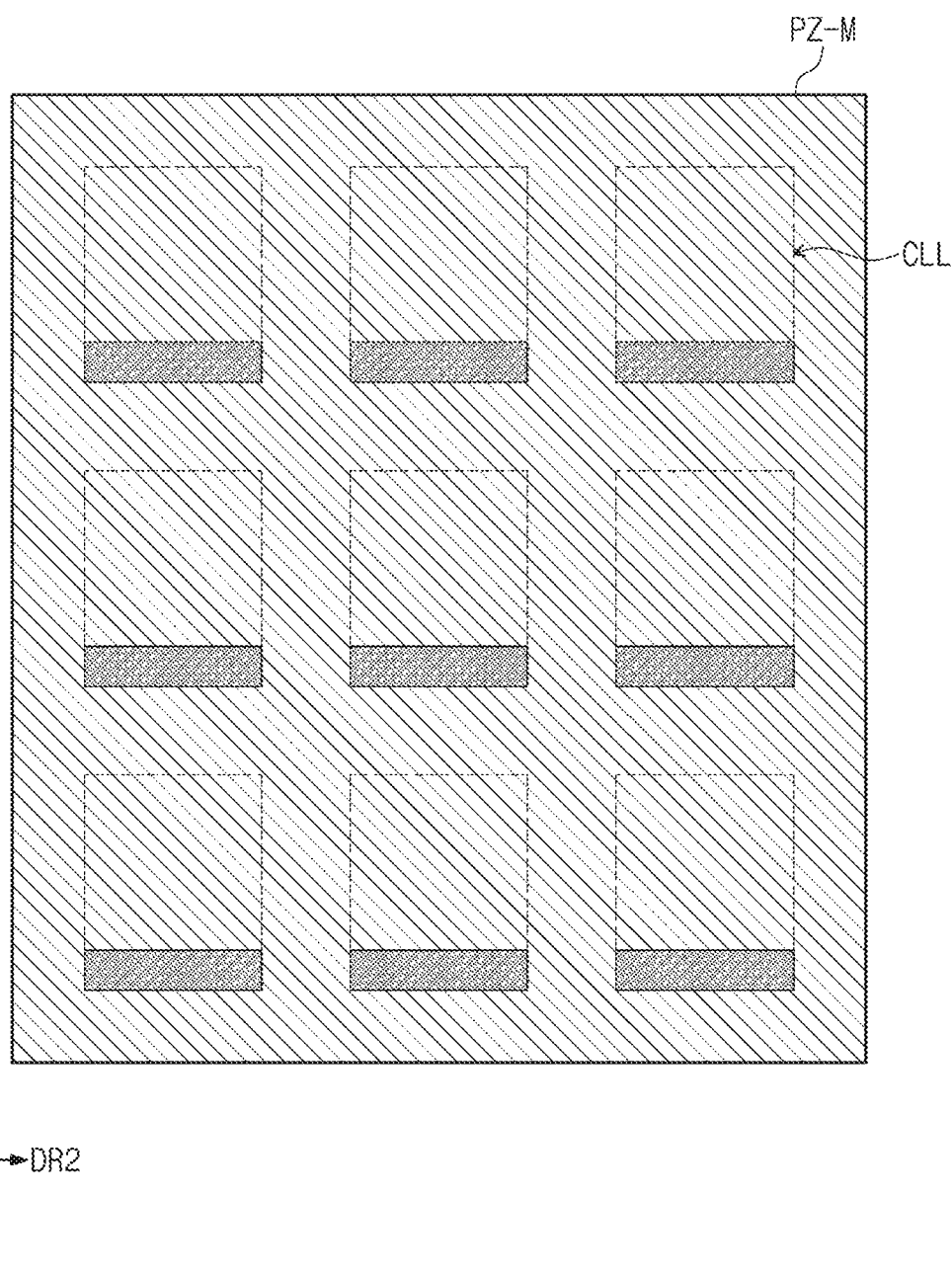

Referring to FIGS. 14, 15, and 16, a mother glass MG and an anti-reflection plate PZ-M are aligned with each other in the alignment process (S110). Referring to FIGS. 14 and 17, the mother glass MG and the anti-reflection plate PZ-M, which are aligned with each other, adhere to each other in the adhesion process (S130). Here, a second adhesion member may be used. Descriptions with respect to the second adhesion member are the same as the above-mentioned descriptions and thus will be omitted.

The mother glass MG includes a plurality of cells CLL, and each of the plurality of cells CLL corresponds to the display module DM (see FIG. 8). Although 9 cells CLL are provided in FIG. 15, exemplary embodiments are not limited thereto. Each of the cells CLL includes a display area DA, a non-display area NDA, and a pad area PD. Display panel pads PD-DP (see FIG. 4) may be disposed on the pad area PD. Each of the display area DA and the non-display area NDA may be defined as a non-pad area.

Referring to FIG. 16, the anti-reflection plate PZ-M may reduce reflectance of light incident from the outside, and the anti-reflection plate PZ-M may be cut to form an anti-reflection member PZ (see FIG. 8). A plurality of openings OP-PD are defined in the anti-reflection plate PZ-M. Each of the openings OP-PD corresponds to the pad area PD. Each of the openings OP-PD may sufficiently expose the corresponding pad area PD.

When the mother glass MG and the anti-reflection plate PZ-M are aligned with each other, a vertex of each of the openings OP-PD may be used as an aligning mark. However, exemplary embodiments are not limited thereto. For example, the mother glass MG and the anti-reflection plate PZ-M may be aligned with each other by using a separate aligning mark.

Figure 18:
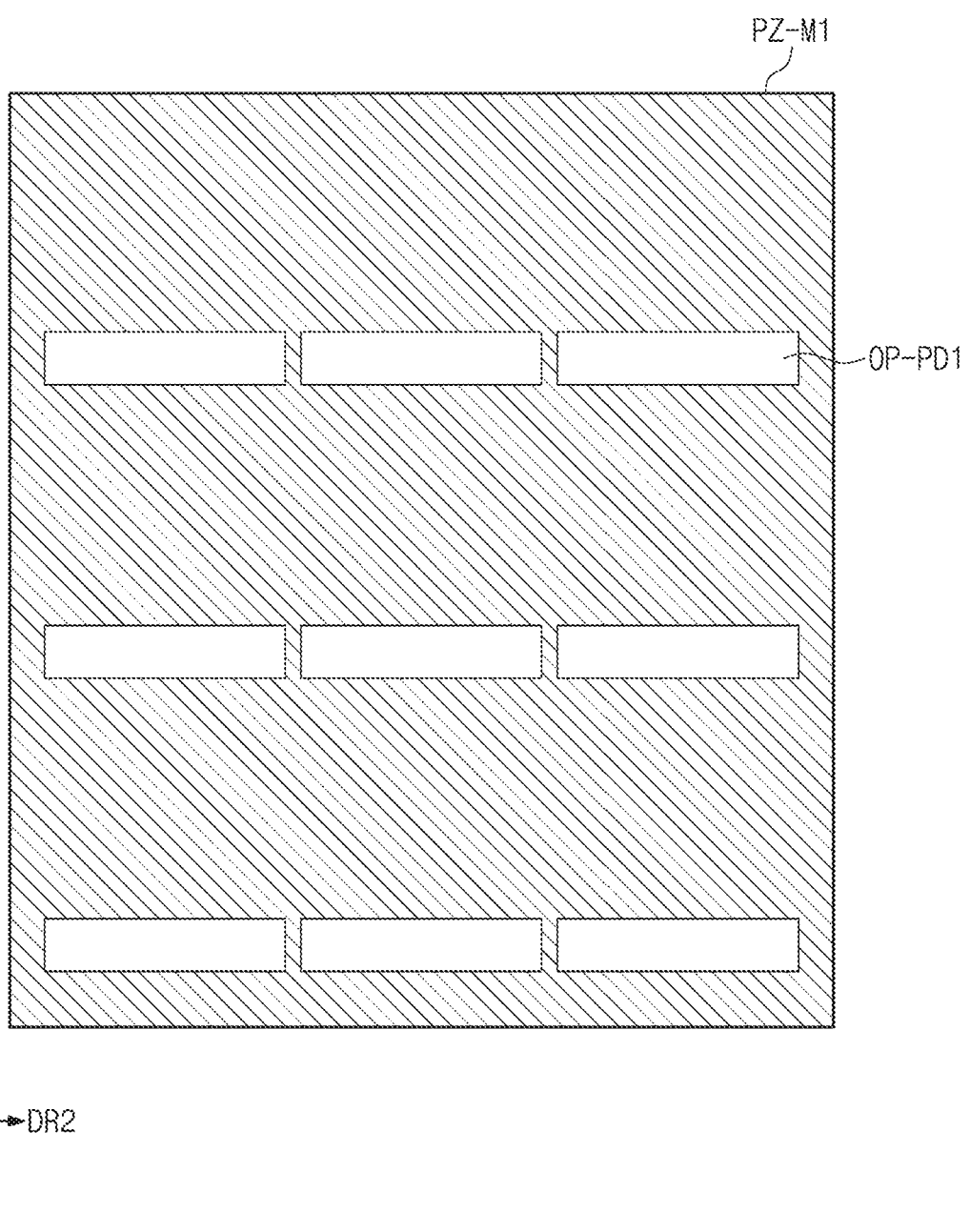
FIG. 18 is a view of an anti-reflection plate according to an exemplary embodiment.
Figure 19:
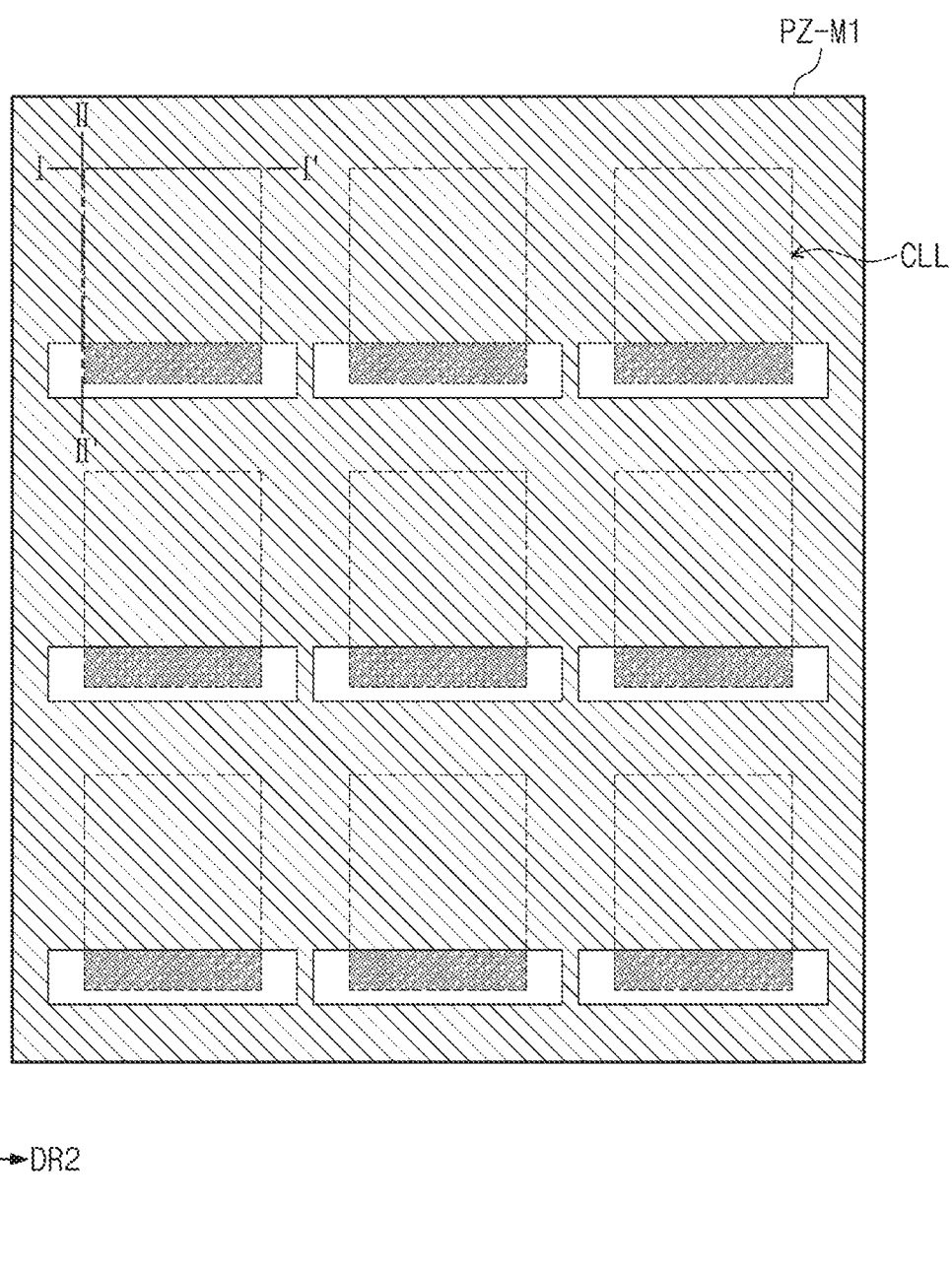
FIG. 19 is a plan view illustrating a state in which a mother glass and the anti-reflection plate adhere to each other.

FIG. 18 is a plan view of an anti-reflection plate PZ-M1 according to an exemplary embodiment. FIG. 19 is a plan view illustrating a state in which the mother glass MG (see FIG. 15) and the anti-reflection plate PZ-M1 adhere to each other. A plurality of openings OP-PD1 are defined in the anti-reflection plate PZ-M1. Each of the plurality of openings OP-PD1 has a size greater than that of each of the openings OP-PD of FIG. 16. Thus, each of the openings OP-PD1 may easily expose the corresponding pad area PD. Also, since each of the openings OP-PD1 has a width greater than that of the corresponding pad area PD, an error due to an tolerances generated during the alignment process may be reduced.

Figure 20:
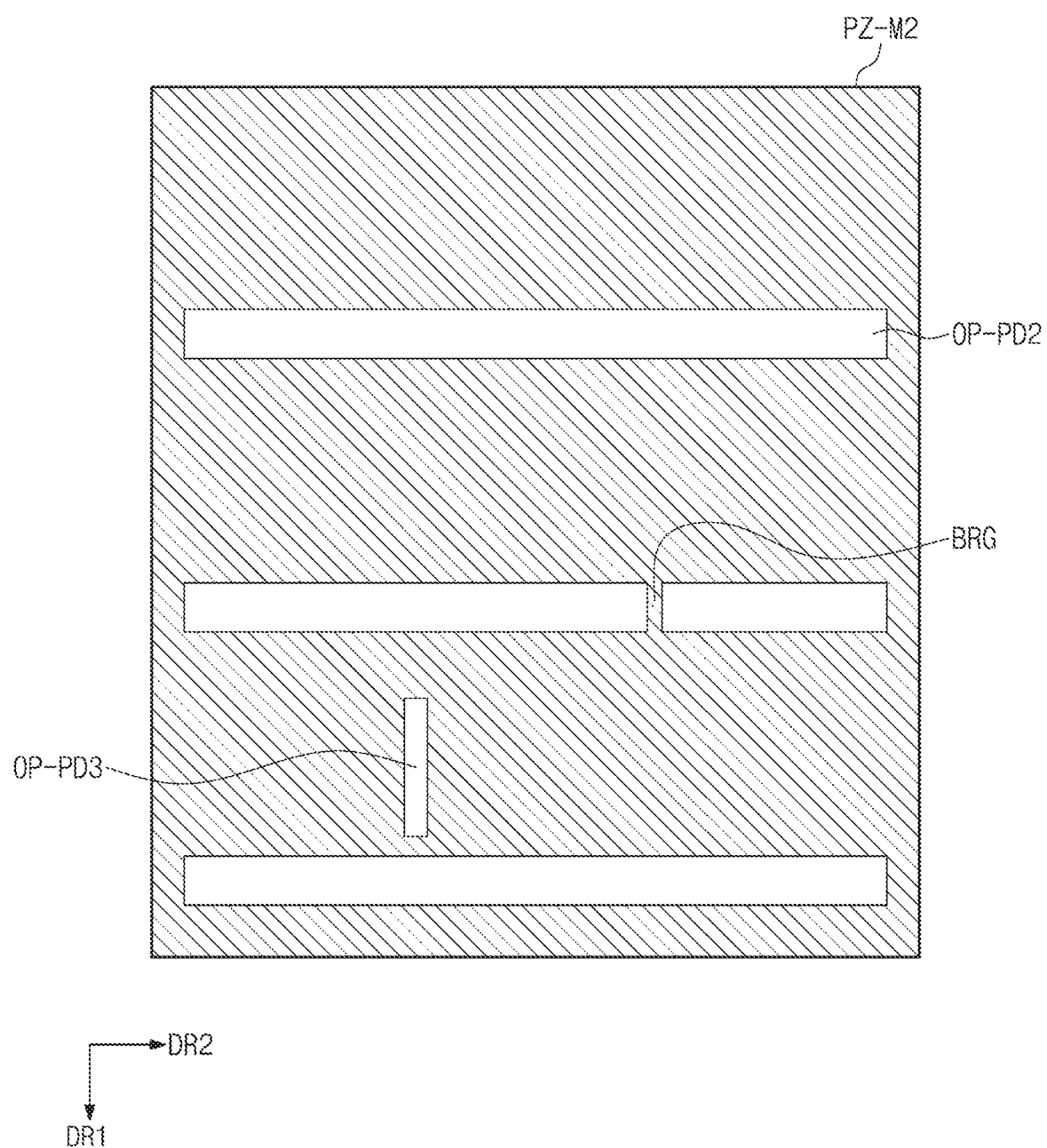
FIG. 20 is a view of the anti-reflection plate according to an exemplary embodiment.
Figure 21:
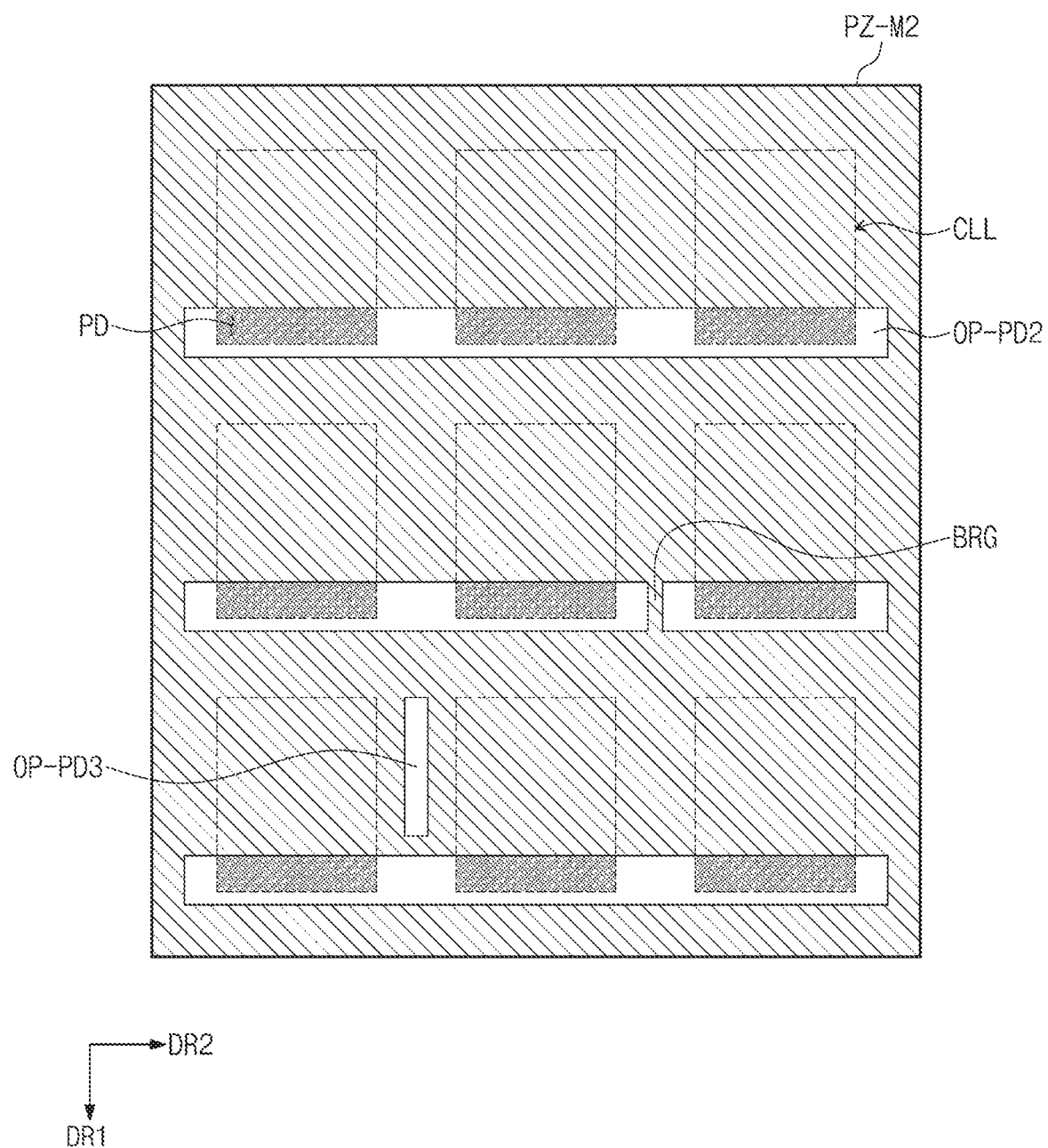
FIG. 21 is a plan view illustrating a state in which the mother glass and the anti-reflection plate adhere to each other.

FIG. 20 is a plan view of an anti-reflection plate PZ-M2 according to an exemplary embodiment. FIG. 21 is a plan view illustrating a state in which the mother glass MG (see FIG. 15) and the anti-reflection plate PZ-M2 (see FIG. 20) adhere to each other.

A plurality of openings OP-PD2 are defined in the anti-reflection plate PZ-M2. Each of the openings OP-PD2 may expose the plurality of pad areas PD. Accordingly, convenience in manufacturing process may be improved.

The anti-reflection plate PZ-M2 may include a bridge BRG that crosses at least one of the openings OP-PD2. As illustrated in FIG. 20, when each of the openings OP-PD2 in the anti-reflection plate PZ-M2 has a wide area, the anti-reflection plate may be soft and thus be difficult to be treated. The anti-reflection plate PZ-M2 may further includes the bridge BRG to prevent the anti-reflection plate PZ-M2 from being flabby and improve the convenience in manufacturing process.

A dummy opening OP-PD3 may be further defined in the anti-reflection plate PZ-M2. When the anti-reflection plate PZ-M2 includes the bridge BRG, distortion of the anti-reflection plate PZ-M2 may occur. Here, the distortion may be prevented by the dummy opening OP-PD3.

FIGS. 22A to 26B are cross-sectional views illustrating the cutting process (S150) of FIG. 10 according to an exemplary embodiment. The cutting process (S150) includes a first cutting process in which the anti-reflection plate PZ-M is cut by using an upper cutting member NFH and a second cutting process in which the mother glass MG is cut by using a lower cutting member NFL.

Figure 22A:
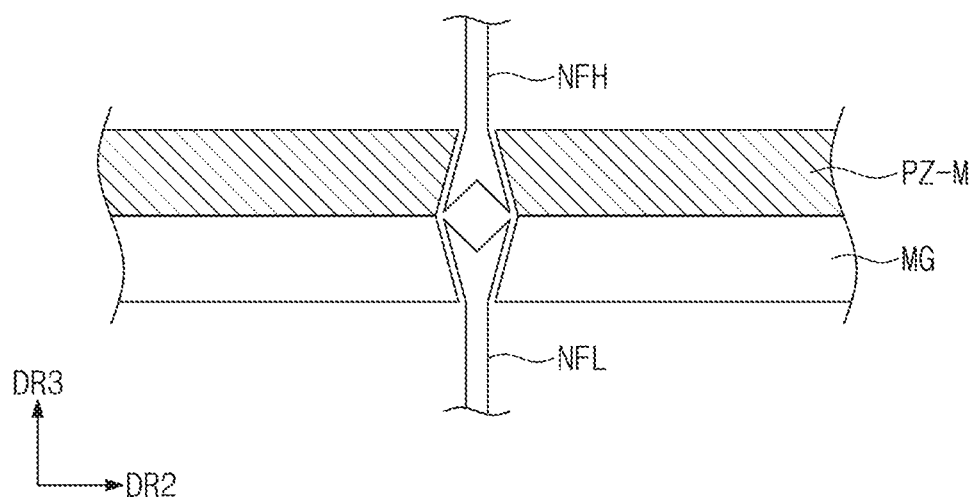
FIG. 22A, FIG. 22B, FIG. 23A, FIG. 23B, FIG. 24A, FIG. 24B, FIG. 25A, FIG. 25B, FIG. 26A, and FIG. 26B are cross-sectional views illustrating a cutting process of FIG. 14 according to an exemplary embodiment.
Figure 22B:
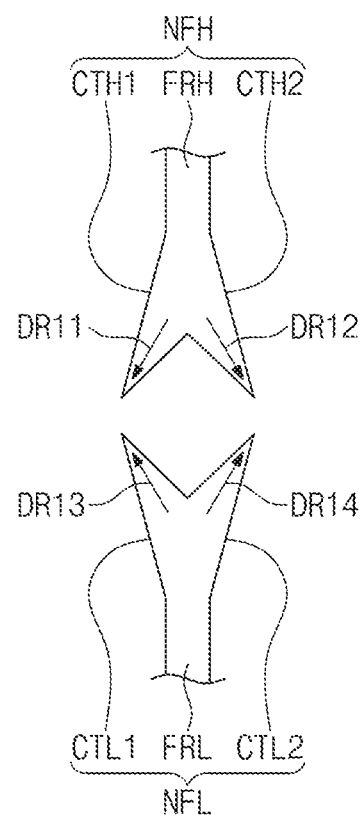

FIG. 22A is a cross-sectional view illustrating the cutting process (S150) of FIG. 14 according to an exemplary embodiment. FIG. 22B is a cross-sectional view of the cutting members NFH and NFL of FIG. 22A.

In an exemplary embodiment, an assembly of the mother glass MG and the anti-reflection plate PZ-M may be cut at upper and lower portions thereof by the cutting members NFH and NFL at the same time. The cutting members NFH and NFL include the upper cutting member NFH and the lower cutting member NFL. The upper cutting member NFH may cut the anti-reflection plate PZ-M, and the lower cutting member NFL may cut the mother glass MG.

The upper cutting member NFH may include an upper frame FRH, a first upper cutter CTH1, and a second upper cutter CTH2. The first upper cutter CTH1 extends from the upper frame FRH in one direction DR11. The second upper cutter CTH2 extends from the upper frame FRH in the other direction DR12 different from the one direction DR11. In an exemplary embodiment, an angle between the one direction DR11 and the other direction DR12 may range from about 0 degree to about 90 degrees.

The lower cutting member NFL may include a lower frame FRL, a first lower cutter CTL1, and a second lower cutter CTL2. The first lower cutter CTL1 extends from the lower frame FRL in a direction DR13 opposite to the other direction DR12. The second lower cutter CTL2 extends from the lower frame FRL in a direction DR14 opposite to the one direction DR11.

Figure 23A:
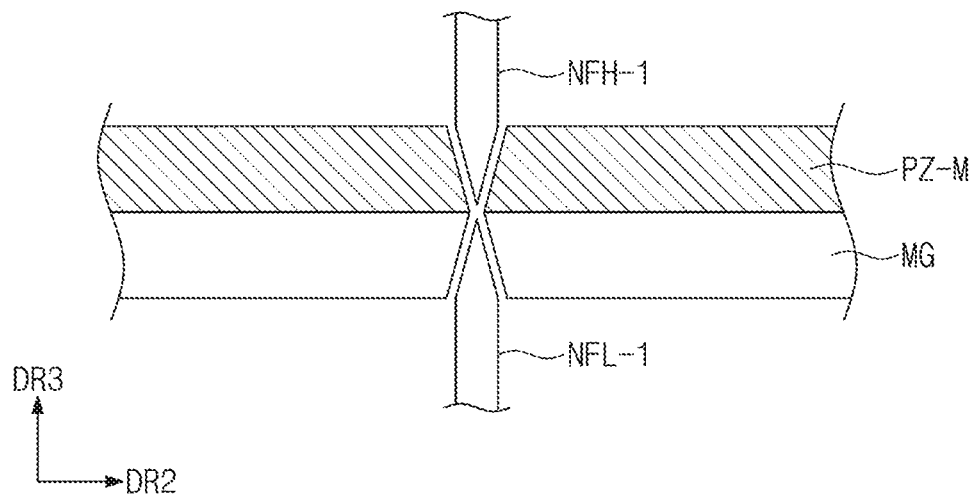
Figure 23B:
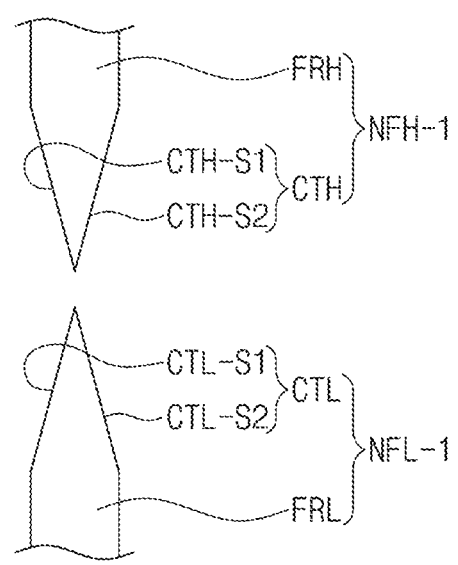

FIG. 23A is a cross-sectional view illustrating the cutting process (S150) of FIG. 14 according to an exemplary embodiment. FIG. 23B is a cross-sectional view of cutting members NFH-1 and NFL-1 of FIG. 23A.

In an exemplary embodiment, an assembly of the mother glass MG and the anti-reflection plate PZ-M may be cut at upper and lower portions thereof by the cutting members NFH-1 and NFL-1 at the same time. The cutting members NFH-1 and NFL-1 include an upper cutting member NFH-1 and a lower cutting member NFL-1. The upper cutting member NFH-1 may cut the anti-reflection plate PZ-M, and the lower cutting member NFL-1 may cut the mother glass MG.

The upper cutting member NFH-1 includes an upper frame FRH and an upper cutter CTH extending from the upper frame FRH. The upper cutter CTH includes a first upper cutter surface CTH-S1 and a second upper cutter surface CTH-S2. In an exemplary embodiment, an angle between the first upper cutter surface CTH-S1 and the second upper cutter surface CTH-S2 may be an acute angle.

The lower cutting member NFL-1 includes a lower frame FRL and a lower cutter CTL extending from the lower frame FRL. The lower cutter CTL includes a first lower cutter surface CTL-S1 and a second lower cutter surface CTL-S2. In an exemplary embodiment, an angle between the first lower cutter surface CTL-S1 and the second lower cutter surface CTL-S2 may be an acute angle.

Figure 24A:
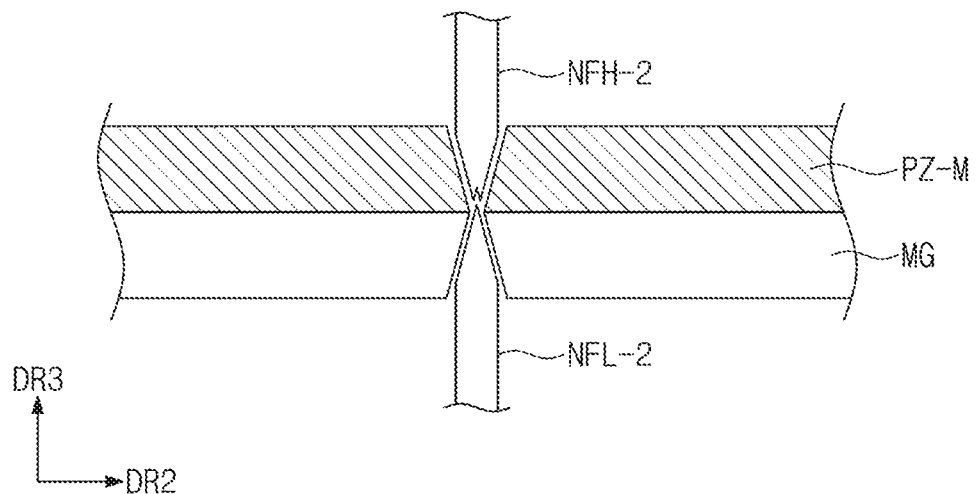
Figure 24B:
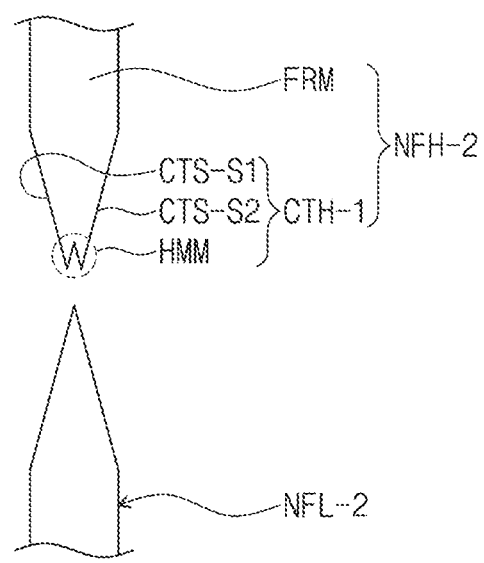

FIG. 24A is a cross-sectional view illustrating the cutting process (S150) of FIG. 14 according to an exemplary embodiment. FIG. 24B is a cross-sectional view of cutting members NFH-2 and NFL-2 of FIG. 24A. The cutting members NFH-2 and NFL-2 include an upper cutting member NFH-2 and a lower cutting member NFL-2. The upper cutting member NFH-2 may cut the anti-reflection plate PZ-M, and the lower cutting member NFL-2 may cut the mother glass MG.

The upper cutting member NFH-2 includes an upper frame FRM and an upper cutter CTH-1 extending from the upper frame FRH. The upper cutter CTH-1 includes a groove HMM corresponding to an end of the lower cutting member NFL-2. Descriptions with respect to other components are substantially the same as those of the components of FIGS. 23A and 23B and thus will be omitted.

The groove HMM may reduce direct contact between the upper cutting member NFH-2 and the lower cutting member NFL-2 to prevent the cutting members NFH-2 and NFL-2 from being worn down.

Also, the cutting performed by the cutting members NFL, NFH, NFL-1, NFH-1, NFL-2, and NFH-2 of the inventive concepts may be performed on one surface at a time, but is not limited thereto. For example, the cutting may be performed on at least two surfaces at the same time.

Figure 25A:
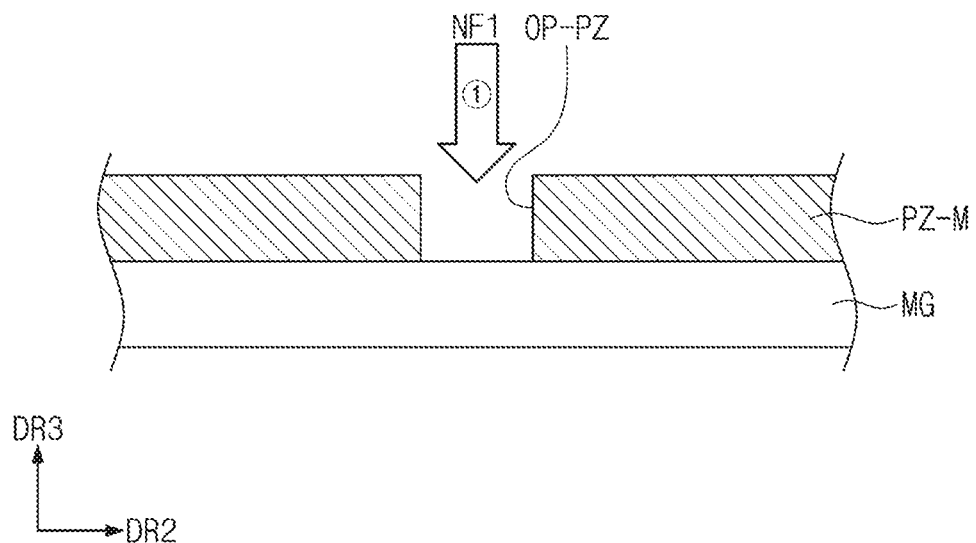
Figure 25B:
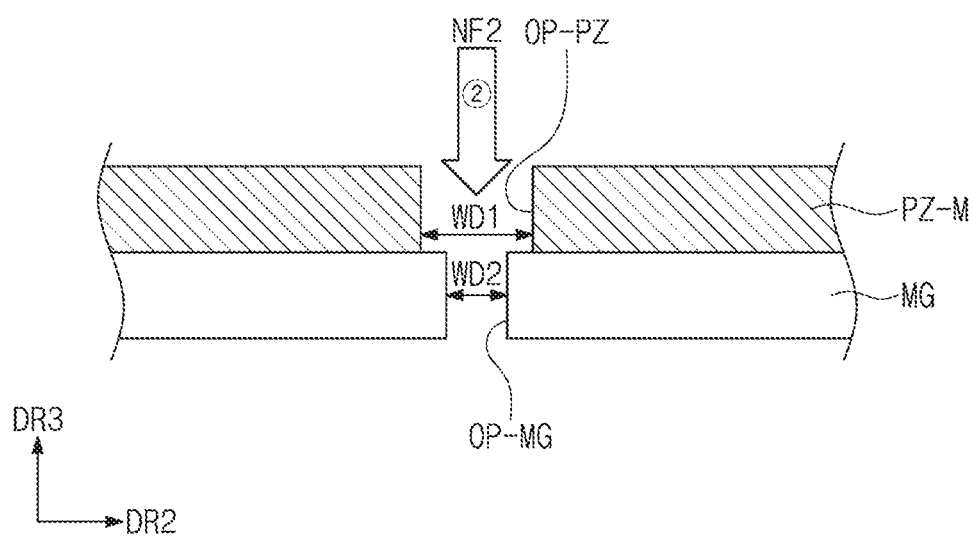

FIGS. 25A and 25B are cross-sectional views illustrating the cutting process (S150) of FIG. 14 according to an exemplary embodiment. In an exemplary embodiment, an assembly of the mother glass MG and the anti-reflection plate PZ-M may be successively cut by the cutting members NF1 and NF2.

Referring to FIG. 25A, the anti-reflection plate PZ-M may be cut by the first cutting member NF1. Referring to FIG. 25B, the mother glass MG may be cut by the second cutting member NF2. In an exemplary embodiment, the cutting performed by the second cutting member NF2 may be performed by passing the opening OP-PZ defined by the first cutting member NF1. Thus, the opening OP-PZ defined in the anti-reflection plate PZ-M may have a width WD1 greater than a width WD2 of an opening OP-MG defined in the mother glass MG. However, exemplary embodiments are not limited thereto. For example, the cutting of the second cutting member NF2 may be performed in a direction opposite to the cutting direction of the first cutting member NF1.

Figure 26A:
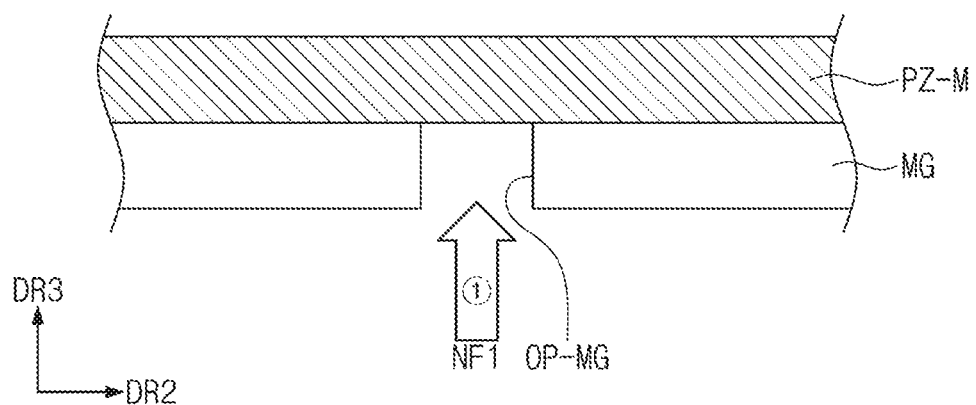
Figure 26B:
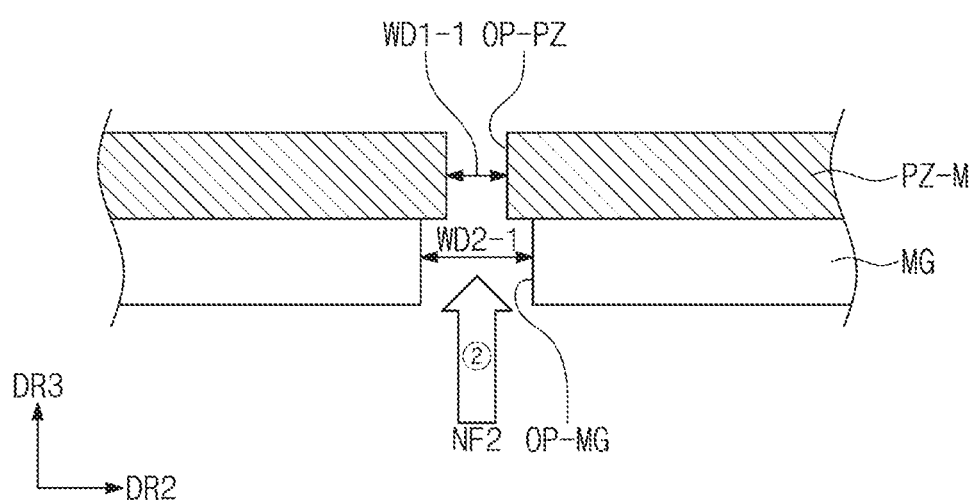

FIGS. 26A and 26B are cross-sectional views illustrating the cutting process (S150) of FIG. 14 according to an exemplary embodiment. In an exemplary embodiment, an assembly of the mother glass MG and the anti-reflection plate PZ-M may be successively cut by the cutting members NF1 and NF2.

Referring to FIG. 26A, the mother glass MG may be cut by the first cutting member NF1. Referring to FIG. 26B, the anti-reflection plate PZ-M may be cut by the second cutting member NF2. In an exemplary embodiment, the cutting performed by the second cutting member NF2 may be performed by passing the opening OP-MG defined by the first cutting member NF1. Thus, the opening OP-MG defined in the mother glass MG may have a width WD2-1 greater than a width WD1-1 of the opening OP-PZ defined in the anti-reflection plate PZ-M. However, exemplary embodiments are not limited thereto. For example, the cutting of the second cutting member NF2 may be performed in a direction opposite to the cutting direction of the first cutting member NF1.

In FIGS. 25A to 26B, each of the first and second cutting members NF1 and NF2 may be one of the following: a cutting member including a blade, a cutting member that releases laser, and a cutting member that releases heat.

Also, the cutting performed by the cutting members NF1 and NF2 of the inventive concept may be performed on one surface at a time, but is not limited thereto. For example, the cutting may be performed on at least two surfaces at the same time.

Figure 27A:
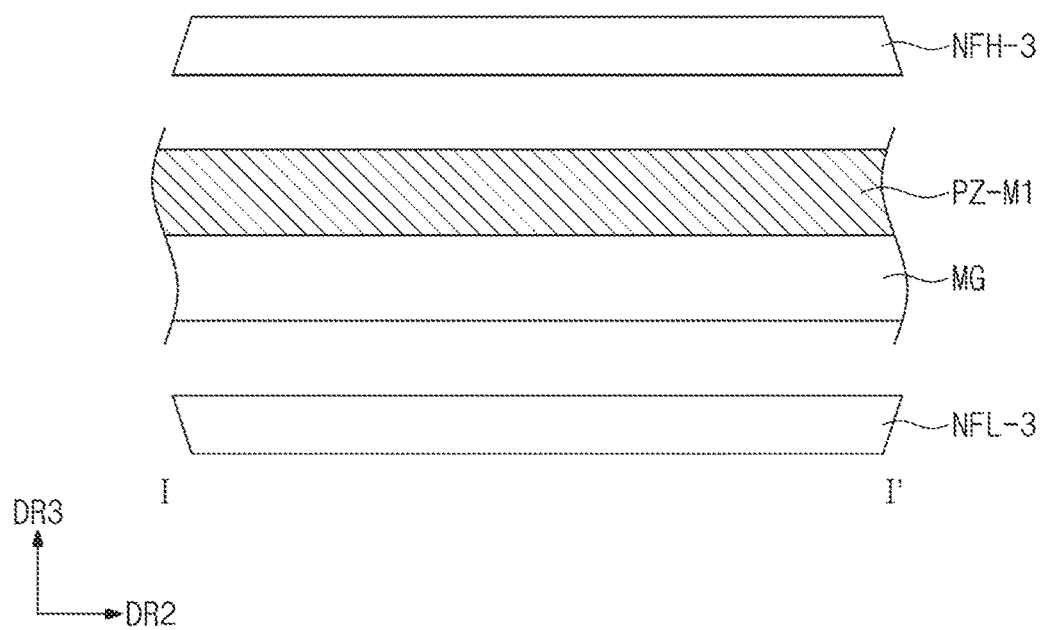
FIG. 27A and FIG. 27B are cross-sectional views illustrating the cutting process of FIG. 14 according to an exemplary embodiment.
Figure 27B:
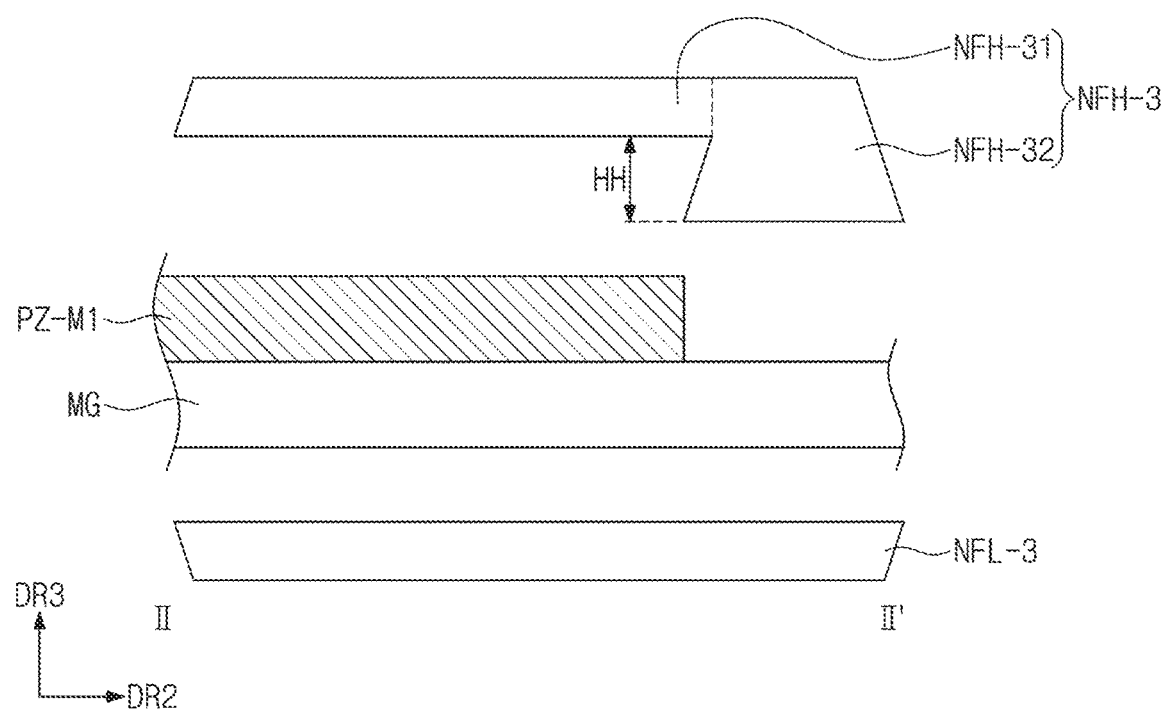

FIGS. 27A and 27B are cross-sectional views illustrating the cutting process (S150) of FIG. 14 according to an exemplary embodiment. In an exemplary embodiment, an assembly of the mother glass MG and an anti-reflection plate PZ-M1 may be cut by cutting members NFH-3 and NFL-3 at the same time.

FIG. 27A is a cross-sectional view of the assembly of the mother glass MG and the anti-reflection plate PZ-M1, which is taken along line I-I'. When taken along line I-I', since a stepped portion does not exist on the assembly of the mother glass MG and an anti-reflection plate PZ-M1, a stepped portion may also not exist on the upper cutting member NFH-3 and the lower cutting member NFL-3.

FIG. 27B is a cross-sectional view of the assembly of the mother glass MG and the anti-reflection plate PZ-M1, which is taken along line II-II'. When taken along line since a stepped portion exists on the assembly of the mother glass MG and an anti-reflection plate PZ-M1, a stepped portion having a predetermined height HH may also exist on the upper cutting member NFH-3. Since the upper cutting member NFH-3 includes the stepped portion having the predetermined height HH, the assembly of the mother glass MG and the anti-reflection plate PZ-M1 may be more precisely cut.

In more detail, the upper cutting member NFH-3 may include a first upper cutting member NFH-31 and a second upper cutting member NFH-32. A length of the second upper cutting member NFH-32 in the third direction DR3 may be greater than that of the first upper cutting member NFH-31 in the third direction DR3. A difference between the length of the first upper cutting member NFH-31 and the length of the second upper cutting member NFH-32 may correspond to the predetermined height HH.

The first upper cutting member NFH-31 may cut the mother glass MG and the anti-reflection plate PZ-M1 together with the lower cutting member NFL-3. The second upper cutting member NFH-32 may cut only the mother glass MG together with the lower cutting member NFL-3. As described above, when the anti-reflection plate PZ-M and the mother glass MG are cut, cutting conditions may vary according to a modulus and thickness of each of layers. For example, when the cutting is performed by using the cutting member including the blade, the blade for cutting a relatively thin portion may have a length greater than that of the blade for cutting a relatively thick portion, and the blade for cutting a portion having a relatively large modulus may have a length greater than that of the blade for cutting a portion having a relatively small modulus.

For example, when the cutting is performed by using the laser beam, the laser beam for cutting a relatively thin portion may have an intensity less than that of the laser beam for cutting a relatively thick portion, and the laser beam for cutting a portion having a relatively large modulus may have an intensity greater than that of the layer beam for cutting a portion having a relatively small modulus.

Figure 28:
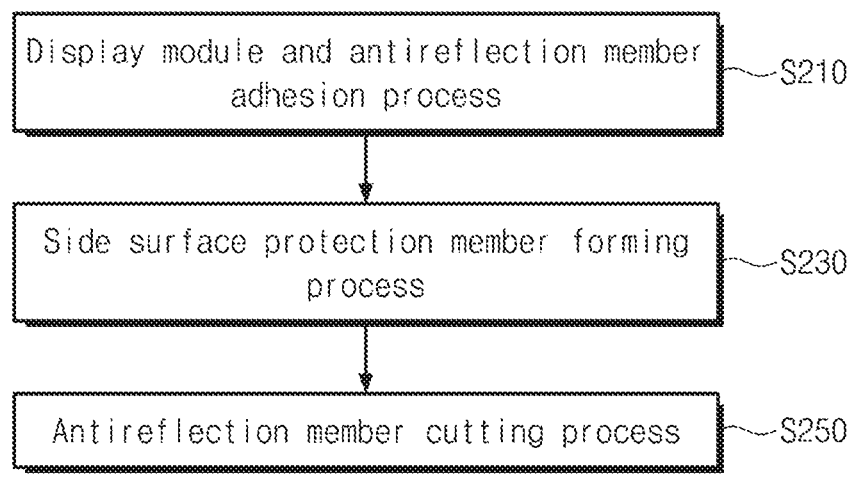
FIG. 28 is a flowchart illustrating a method for manufacturing the display device according to an exemplary embodiment.

FIG. 28 is a flowchart illustrating a method for manufacturing the display device DD according to an exemplary embodiment. FIGS. 29A to 29D are views illustrating the processes of FIG. 28, respectively.

Referring to FIG. 28, a method for manufacturing the display device DD according to an exemplary embodiment includes a display module and anti-reflection member adhesion process (S210), a side surface protection member forming process (S230), and an anti-reflection member cutting process (S250).

Figure 29A:
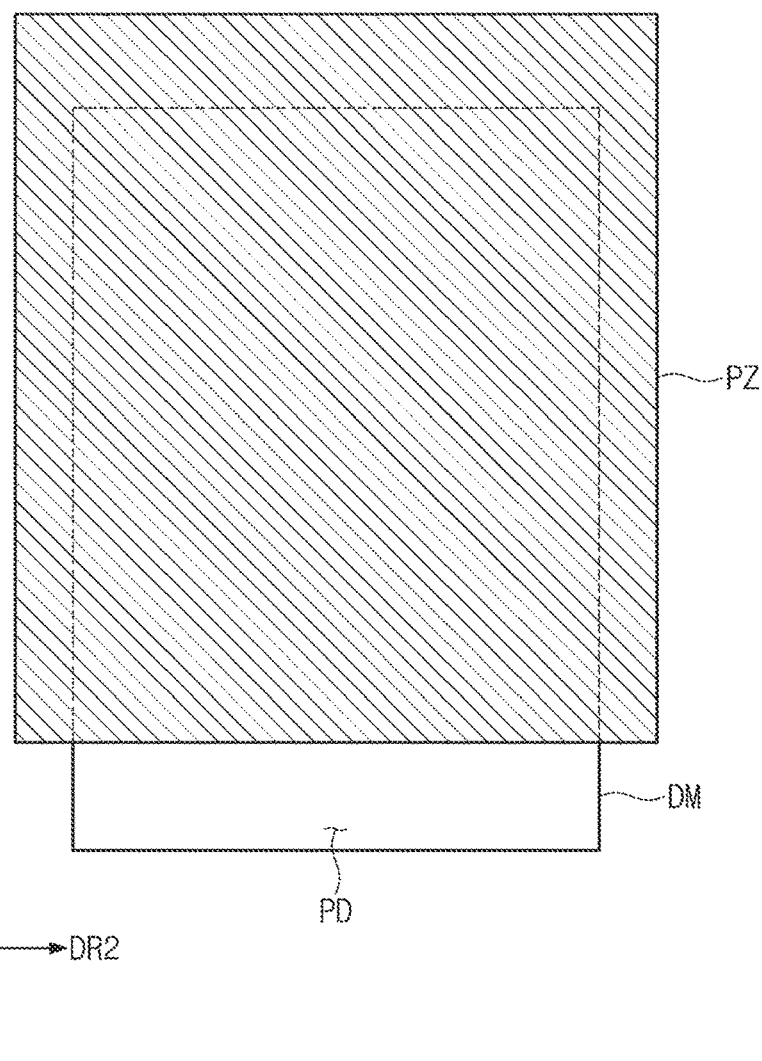
FIG. 29A, FIG. 29B, FIG. 29C, and FIG. 29D are views illustrating processes of FIG. 19, respectively.

Referring to FIGS. 28 and 29A, in the display module and anti-reflection member adhesion process (S210), an anti-reflection member PZ adheres to a display module DM. Here, a pad area PD of the display module DM is exposed to the outside as ever.

Figure 29B:
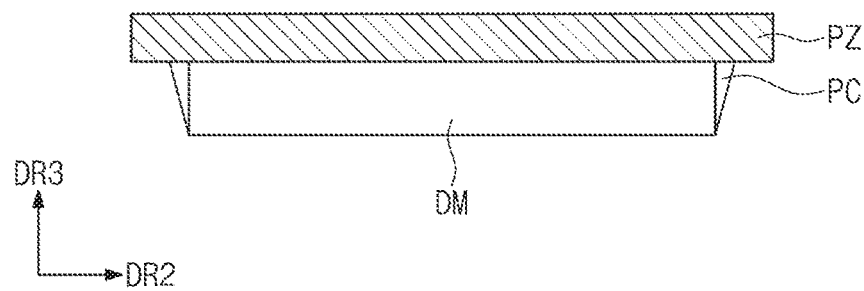

Referring to FIGS. 28 and 29B, in the side surface protection member forming process (S230), a side surface protection member PC is formed on a side surface of the display module DM. The side surface protection member PC may be substantially the same as the side surface protection member PT of FIG. 9B.

Figure 29C:
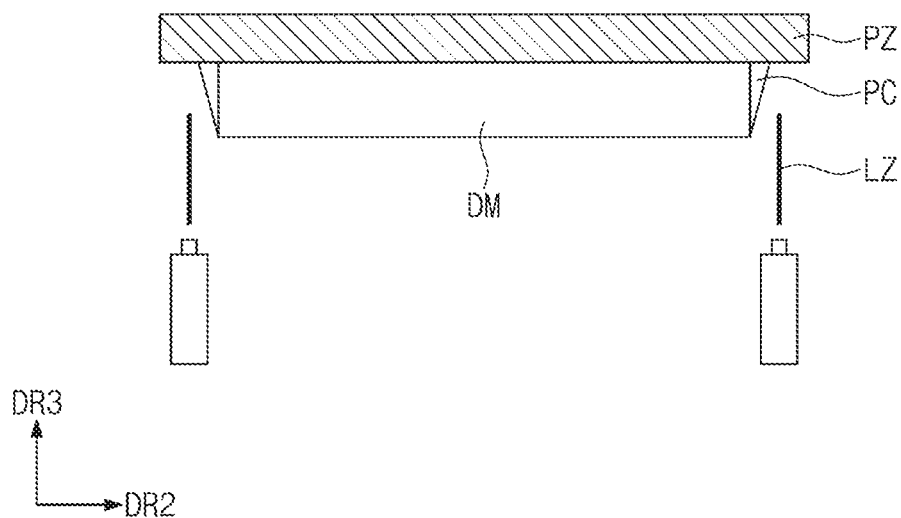

Referring to FIGS. 28 and 29C, in the anti-reflection member cutting process (S250), a laser beam LZ is irradiated on a portion of the anti-reflection member PZ, which does not overlap the display module DM. Here, the side surface protection member PC may prevent the display module DM from being damaged by the laser beam LZ.

Figure 29D:
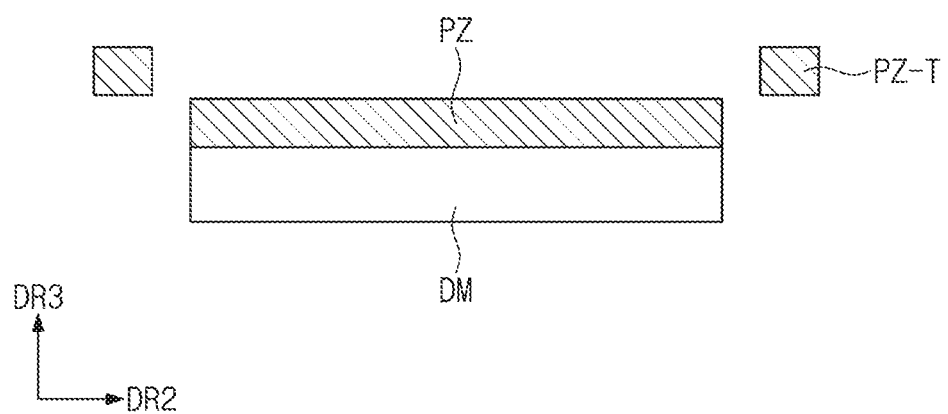

Referring to FIGS. 28 and 29D, the portion of the anti-reflection member PZ, which does not overlap the display module DM is PZ-T, it is cut and removed by the laser beam LZ.

Figure 30:
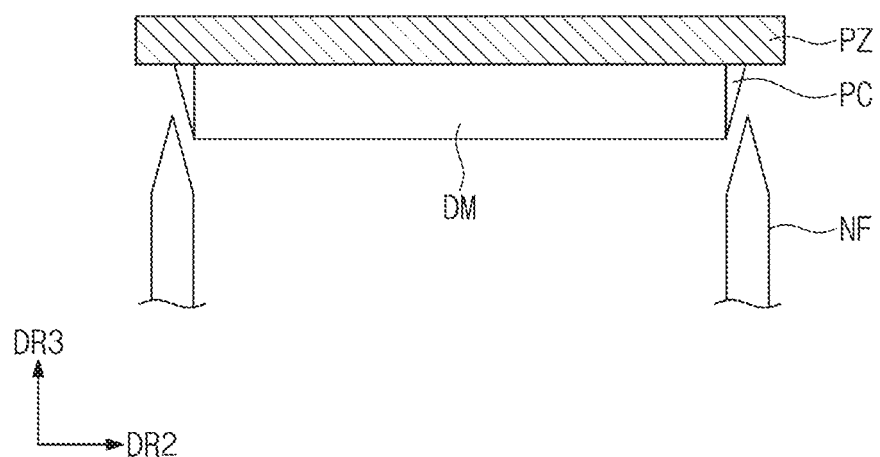
FIG. 30 is a view illustrating a modified example of FIG. 29C.

FIG. 30 is a view illustrating a modified example of FIG. 29C. Referring to FIG. 30, in the anti-reflection member cutting process (S250), the portion of the member PZ, which does not overlap the display module DM, may be cut by using physical force of the cutting member NF including the blade.

Figure 31A:
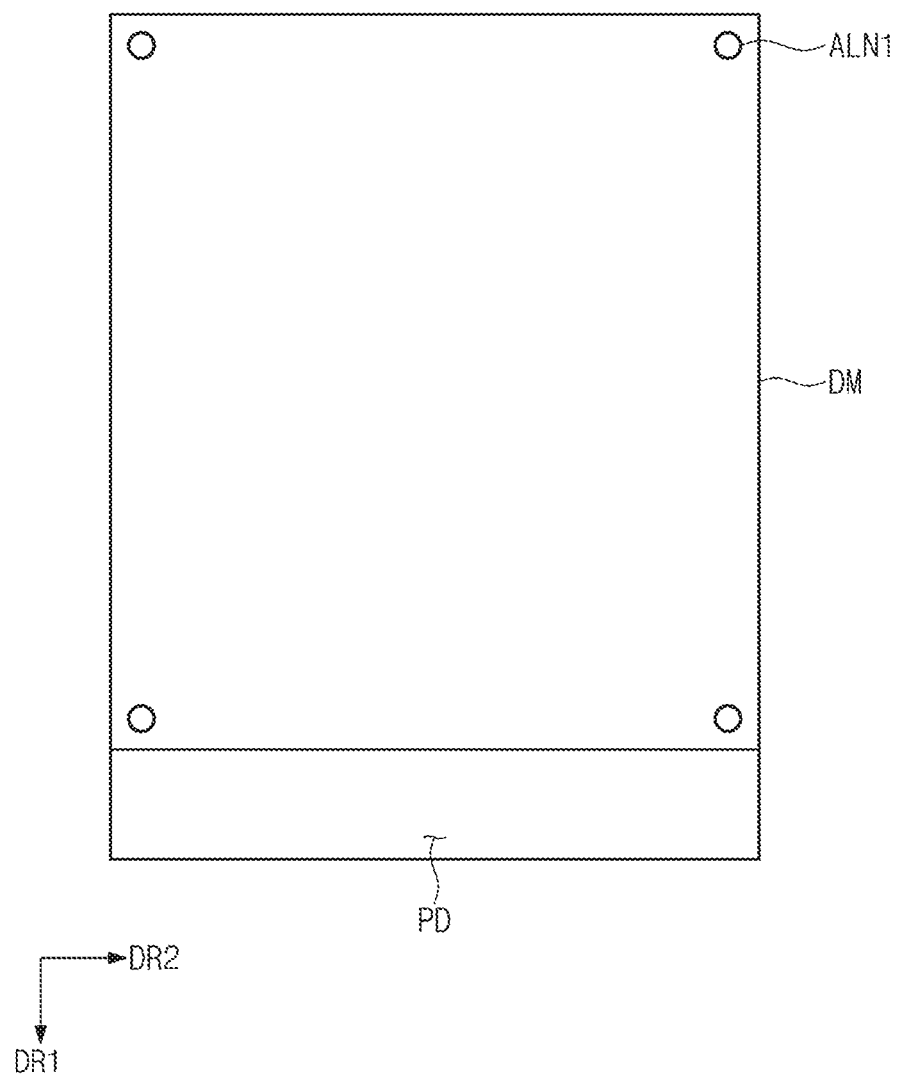
FIG. 31A, FIG. 31B, and FIG. 31C are views illustrating a method for manufacturing the display device according to an exemplary embodiment.
Figure 31B:
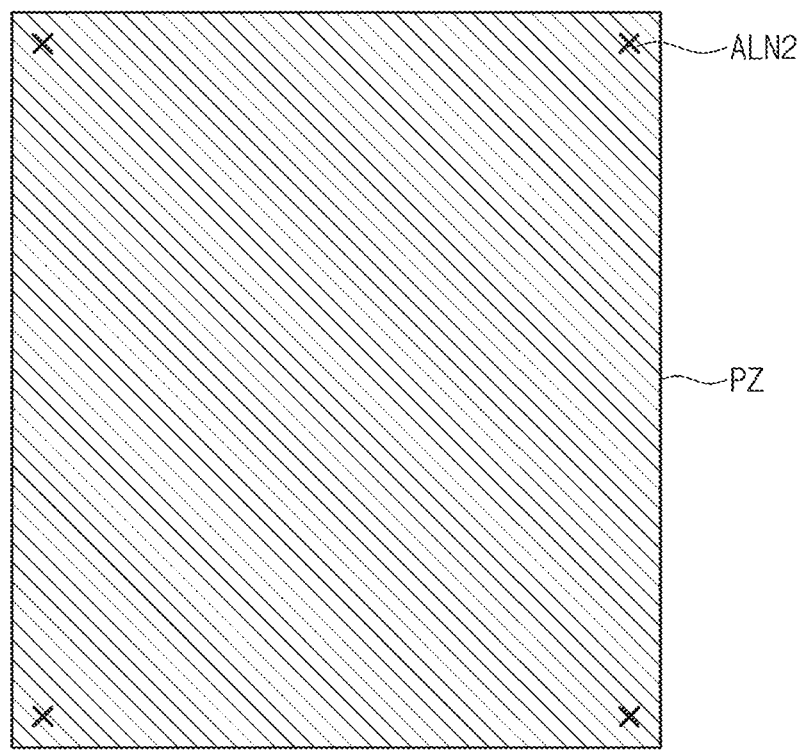
Figure 31B:
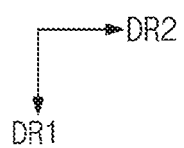
Figure 31C:
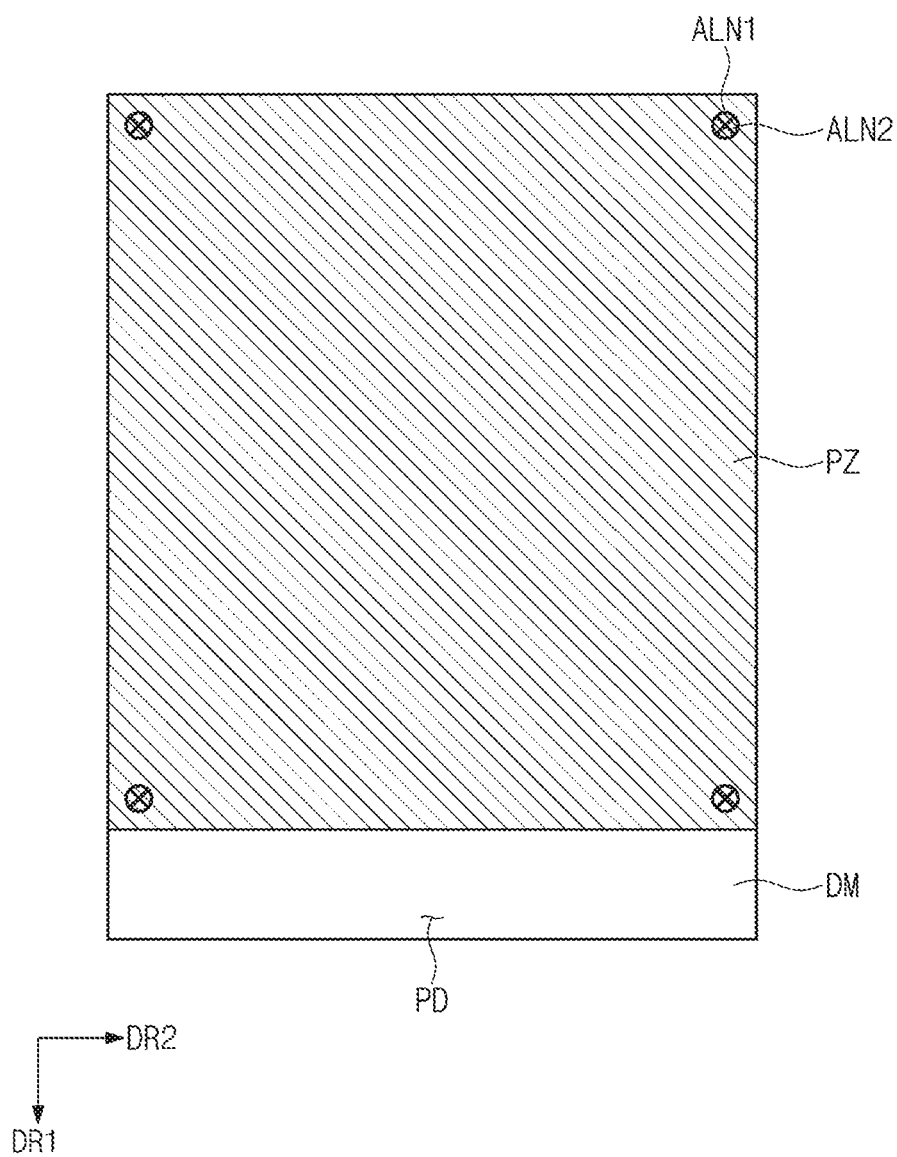

FIGS. 31A, 31B, and 31C are views illustrating a method for manufacturing the display device DD according to an exemplary embodiment.

Referring to FIG. 31A, first alignment marks ALN1 are disposed on corners of the display module DM. Although four first alignment marks ALN1 are illustrated as an example in FIG. 31A, exemplary embodiments are not limited thereto.

Referring to FIG. 31B, second alignment marks ALN2 are disposed on corners of the anti-reflection member PZ. The second alignment marks ALN2 correspond to the first alignment marks ALN1, respectively. Although four second alignment marks ALN2 are illustrated as an example in FIG. 31B, exemplary embodiments are not limited thereto.

Referring to FIG. 31C, the display module DM may be aligned with and attached to the anti-reflection member PZ by using the first alignment marks ALN1 and the second alignment marks ALN2.

In an exemplary embodiment, the display module DM may be understood as the base layer SUB in FIGS. 14 to 30C. In an exemplary embodiment, the anti-reflection member PZ may be understood as the functional layer FL.

According to the exemplary embodiments of the inventive concepts, the dead space generated when the display module cutting process is performed may be reduced to reduce an increase in tolerances occurring in the process. Also, the delamination generated between the films disposed on the side surface of the display module may be prevented.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A display device, comprising:
   a display module; and
   an anti-reflection member disposed on the display module to reduce reflectance of light incident from an outside area,
   wherein one side of the display module has a first shape that gradually decreases in thickness in an outward direction, and one side of the anti-reflection member, which corresponds to the one side of the display module, has a second shape that gradually decreases in thickness in an outward direction,
   wherein the display module comprises:
   a display panel including a light emitting element;
   a touch sensing layer disposed on the display panel; and
   a protection film disposed under the display panel, and
   wherein the one side of the display module defined by sides of the display panel, the touch sensing layer, and the protection film has an inclined surface.

2. The display device of claim 1, wherein an inclination of one side surface of the display module is different from an inclination of a corresponding one side surface of the anti-reflection member.

3. The display device of claim 1, wherein the display module comprises:
   a first top surface adjacent to the anti-reflection member;
   a first side surface forming an obtuse angle with the first top surface and extending from the first top surface; and
   a first bottom surface parallel to the first top surface and extending from the first side surface,
   wherein a first shape is defined by the first side surface and the first bottom surface.

4. The display device of claim 3, wherein the anti-reflection member comprises:
a second bottom surface adjacent to the display module;
a second side surface forming an obtuse angle with the second bottom surface and extending from the second bottom surface; and
a second top surface parallel to the second bottom surface and extending from the second side surface,
wherein a second shape is defined by the second side surface and the second top surface.

5. The display device of claim 4, further comprising a side surface protection member disposed on the first side surface and the second side surface, wherein the side surface protection member further comprises acryl.

6. The display device of claim 1, wherein the display module further comprises:
a first top surface adjacent to the anti-reflection member;
a first side surface forming an acute angle with the first top surface and extending from the first top surface; and
a first bottom surface parallel to the first top surface and extending from the first side surface,
wherein a first shape is defined by the first top surface and the first side surface.

7. The display device of claim 6, wherein the anti-reflection member comprises:
a second bottom surface adjacent to the display module;
a second side surface forming an acute angle with the second bottom surface and extending from the second bottom surface; and
a second top surface parallel to the second bottom surface and extending from the second side surface,
wherein a second shape is defined by the second bottom surface and the second side surface.

8. The display device of claim 1, wherein the anti-reflection member comprises a polarization member.

9. A display device, comprising:
an assembly divided into a pad area and having a first thickness and a non-pad area having a second thickness, wherein the second thickness is greater than the first thickness,
wherein one side of a cross-section defined by cutting the assembly in a first direction has a first cross-sectional shape, and
another side of a cross-section defined by cutting the assembly in a direction perpendicular to the first direction has a second cross-sectional shape different from the first cross-sectional shape, and
wherein:
the assembly comprises:
a base layer; and
a functional layer disposed on the base layer;
one side of the base layer has a first shape that gradually decreases in thickness in an outward direction, and one side of the functional layer, which corresponds to the one side of the base layer, has a second shape that gradually decreases in thickness in an outward direction;
the functional layer comprises a barrier layer, a buffer layer, a thin film encapsulation layer, a touch sensing layer, and an anti-reflection member; and
the one side of the functional layer defined by sides of the barrier layer, the buffer layer, the thin film encapsulation layer, the touch sensing layer, and the anti-reflection member has an inclined surface.

10. The display device of claim 9, wherein the functional layer defines the non-pad area.

11. The display device of claim 9, wherein each of the first cross-sectional shape and the second cross-sectional shape comprises:
a first line segment having a first inclination; and
a second line segment having a second inclination different from the first inclination and meeting the first line segment,
wherein a point at which the first line segment and the second line segment meet each other comprises a portion of the assembly having a largest adhesion force between a plurality of layers constituting the assembly.

12. The display device of claim 11, wherein the assembly further comprises a circuit layer and the circuit layer further comprises a plurality of transistors,
wherein the point at which the first line segment and the second line segment meet each other is a portion of the circuit layer.

13. The display device of claim 11, wherein the point at which the first line segment and the second line segment meet each other is a portion of the base layer.

* * * * *